(12) United States Patent
Oganesian et al.

(10) Patent No.: US 8,610,259 B2
(45) Date of Patent: Dec. 17, 2013

(54) MULTI-FUNCTION AND SHIELDED 3D INTERCONNECTS

(75) Inventors: Vage Oganesian, Palo Alto, CA (US); Belgacem Haba, Saratoga, CA (US); Ilyas Mohammed, Santa Clara, CA (US); Craig Mitchell, San Jose, CA (US); Piyush Savalia, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 294 days.

(21) Appl. No.: 12/884,695

(22) Filed: Sep. 17, 2010

(65) Prior Publication Data

US 2012/0068327 A1   Mar. 22, 2012

(51) Int. Cl.
*H01L 23/48* (2006.01)

(52) U.S. Cl.
USPC ............ 257/692; 257/E21.597; 438/667

(58) Field of Classification Search
USPC ............ 257/692, 774, E21.597; 438/667
See application file for complete search history.

(56) References Cited

U.S. PATENT DOCUMENTS

| | | |
|---|---|---|
| 4,682,074 A | 7/1987 | Hoeberechts et al. |
| 4,765,864 A | 8/1988 | Holland et al. |
| 5,229,647 A | 7/1993 | Gnadinger |
| 5,322,816 A | 6/1994 | Pinter |
| 5,481,133 A | 1/1996 | Hsu |
| 5,686,762 A | 11/1997 | Langley |
| 5,700,735 A | 12/1997 | Shiue et al. |
| 5,703,408 A | 12/1997 | Ming-Tsung et al. |
| 5,808,874 A | 9/1998 | Smith |
| 6,005,466 A | 12/1999 | Pedder |
| 6,013,948 A | 1/2000 | Akram et al. |
| 6,022,758 A | 2/2000 | Badehi |
| 6,031,274 A | 2/2000 | Muramatsu et al. |

(Continued)

FOREIGN PATENT DOCUMENTS

| | | |
|---|---|---|
| EP | 0316799 A1 | 5/1989 |
| EP | 0926723 A1 | 6/1999 |

(Continued)

OTHER PUBLICATIONS

David R. Lide et al: 'Handbook of Chemistry and Physics, 77th Edition, 1996-1997', Jan. 1, 1997, CRC Press, Boca Raton, New York, London, Tokyo, XP002670569, pp. 12-90-12-91.

(Continued)

*Primary Examiner* — Julio J Maldonado
*Assistant Examiner* — Robert Bachner
(74) *Attorney, Agent, or Firm* — Lerner, David, Littenberg, Krumholz & Mentlik, LLP

(57) ABSTRACT

A microelectronic unit includes a semiconductor element consisting essentially of semiconductor material and having a front surface, a rear surface, a plurality of active semiconductor devices adjacent the front surface, a plurality of conductive pads exposed at the front surface, and an opening extending through the semiconductor element. At least one of the conductive pads can at least partially overlie the opening and can be electrically connected with at least one of the active semiconductor devices. The microelectronic unit can also include a first conductive element exposed at the rear surface for connection with an external component, the first conductive element extending through the opening and electrically connected with the at least one conductive pad, and a second conductive element extending through the opening and insulated from the first conductive element. The at least one conductive pad can overlie a peripheral edge of the second conductive element.

36 Claims, 8 Drawing Sheets

(56) References Cited

U.S. PATENT DOCUMENTS

| | | |
|---|---|---|
| 6,103,552 A | 8/2000 | Lin |
| 6,143,369 A | 11/2000 | Sugawa et al. |
| 6,143,396 A | 11/2000 | Saran et al. |
| 6,169,319 B1 | 1/2001 | Malinovich et al. |
| 6,181,016 B1 | 1/2001 | Lin et al. |
| 6,261,865 B1 | 7/2001 | Akram |
| 6,277,669 B1 | 8/2001 | Kung et al. |
| 6,284,563 B1 | 9/2001 | Fjelstad |
| 6,313,540 B1 | 11/2001 | Kida et al. |
| 6,362,529 B1 | 3/2002 | Sumikawa et al. |
| 6,368,410 B1 | 4/2002 | Gorczyca et al. |
| 6,399,892 B1 | 6/2002 | Milkovich et al. |
| 6,472,247 B1 | 10/2002 | Andoh et al. |
| 6,492,201 B1 | 12/2002 | Haba |
| 6,498,381 B2 | 12/2002 | Halahan et al. |
| 6,498,387 B1 | 12/2002 | Yang |
| 6,507,113 B1 | 1/2003 | Fillion et al. |
| 6,586,955 B2 | 7/2003 | Fjelstad et al. |
| 6,608,377 B2 | 8/2003 | Chang et al. |
| 6,638,352 B2 | 10/2003 | Satsu et al. |
| 6,693,358 B2 | 2/2004 | Yamada et al. |
| 6,716,737 B2 | 4/2004 | Plas et al. |
| 6,727,576 B2 | 4/2004 | Hedler et al. |
| 6,737,300 B2 | 5/2004 | Ding et al. |
| 6,743,660 B2 | 6/2004 | Lee et al. |
| 6,812,549 B2 | 11/2004 | Umetsu et al. |
| 6,828,175 B2 | 12/2004 | Wood et al. |
| 6,864,172 B2 | 3/2005 | Noma et al. |
| 6,867,123 B2 | 3/2005 | Katagiri et al. |
| 6,873,054 B2 | 3/2005 | Miyazawa et al. |
| 6,879,049 B1 | 4/2005 | Yamamoto et al. |
| 6,927,156 B2 | 8/2005 | Mathew |
| 6,982,475 B1 | 1/2006 | MacIntyre |
| 7,026,175 B2 | 4/2006 | Li et al. |
| 7,068,139 B2 | 6/2006 | Harris et al. |
| 7,091,062 B2 | 8/2006 | Geyer |
| 7,271,033 B2 | 9/2007 | Lin et al. |
| 7,329,563 B2 | 2/2008 | Lo et al. |
| 7,413,929 B2 | 8/2008 | Lee et al. |
| 7,420,257 B2 | 9/2008 | Shibayama |
| 7,436,069 B2 | 10/2008 | Matsui |
| 7,446,036 B1 | 11/2008 | Bolom et al. |
| 7,456,479 B2 | 11/2008 | Lan |
| 7,531,445 B2 | 5/2009 | Shiv |
| 7,531,453 B2 | 5/2009 | Kirby et al. |
| 7,719,121 B2 | 5/2010 | Humpston et al. |
| 7,750,487 B2 | 7/2010 | Muthukumar et al. |
| 7,754,531 B2 | 7/2010 | Tay et al. |
| 7,767,497 B2 | 8/2010 | Haba |
| 7,781,781 B2 | 8/2010 | Adkisson et al. |
| 7,791,199 B2 | 9/2010 | Grinman et al. |
| 7,807,508 B2 | 10/2010 | Oganesian et al. |
| 7,829,976 B2 | 11/2010 | Kirby et al. |
| 7,901,989 B2 | 3/2011 | Haba et al. |
| 7,915,710 B2 | 3/2011 | Lee et al. |
| 7,935,568 B2 | 5/2011 | Oganesian et al. |
| 8,008,192 B2 | 8/2011 | Sulfridge |
| 8,193,615 B2 | 6/2012 | Haba et al. |
| 8,253,244 B2 | 8/2012 | Kang |
| 8,263,434 B2 | 9/2012 | Pagaila et al. |
| 2001/0048591 A1 | 12/2001 | Fjelstad et al. |
| 2002/0061723 A1 | 5/2002 | Duescher |
| 2002/0096787 A1 | 7/2002 | Fjelstad |
| 2002/0109236 A1 | 8/2002 | Kim et al. |
| 2002/0151171 A1 | 10/2002 | Furusawa |
| 2003/0059976 A1 | 3/2003 | Nathan et al. |
| 2003/0071331 A1 | 4/2003 | Yamaguchi et al. |
| 2003/0178714 A1 | 9/2003 | Sakoda et al. |
| 2004/0016942 A1 | 1/2004 | Miyazawa et al. |
| 2004/0017012 A1 | 1/2004 | Yamada et al. |
| 2004/0043607 A1 | 3/2004 | Farnworth et al. |
| 2004/0051173 A1 | 3/2004 | Koh et al. |
| 2004/0061238 A1 | 4/2004 | Sekine |
| 2004/0104454 A1 | 6/2004 | Takaoka et al. |
| 2004/0155354 A1 | 8/2004 | Hanaoka et al. |
| 2004/0173891 A1 | 9/2004 | Imai et al. |
| 2004/0178495 A1 | 9/2004 | Yean et al. |
| 2004/0188819 A1 | 9/2004 | Farnworth et al. |
| 2004/0188822 A1 | 9/2004 | Hara |
| 2004/0217483 A1* | 11/2004 | Hedler et al. ............ 257/774 |
| 2004/0222508 A1 | 11/2004 | Aoyagi |
| 2004/0251525 A1 | 12/2004 | Zilber et al. |
| 2004/0259292 A1 | 12/2004 | Beyne et al. |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0106845 A1* | 5/2005 | Halahan et al. ............ 438/576 |
| 2005/0156330 A1 | 7/2005 | Harris |
| 2005/0248002 A1 | 11/2005 | Newman et al. |
| 2005/0260794 A1 | 11/2005 | Lo et al. |
| 2005/0279916 A1 | 12/2005 | Kang et al. |
| 2005/0282374 A1 | 12/2005 | Hwang et al. |
| 2005/0287783 A1 | 12/2005 | Kirby et al. |
| 2006/0001174 A1 | 1/2006 | Matsui |
| 2006/0001179 A1 | 1/2006 | Fukase et al. |
| 2006/0017161 A1 | 1/2006 | Chung et al. |
| 2006/0043598 A1 | 3/2006 | Kirby et al. |
| 2006/0046348 A1 | 3/2006 | Kang |
| 2006/0046463 A1 | 3/2006 | Watkins et al. |
| 2006/0046471 A1 | 3/2006 | Kirby et al. |
| 2006/0068580 A1 | 3/2006 | Dotta |
| 2006/0071347 A1 | 4/2006 | Dotta |
| 2006/0076019 A1 | 4/2006 | Ho |
| 2006/0079019 A1 | 4/2006 | Kim |
| 2006/0094231 A1 | 5/2006 | Lane et al. |
| 2006/0115932 A1 | 6/2006 | Farnworth et al. |
| 2006/0154446 A1 | 7/2006 | Wood et al. |
| 2006/0175697 A1 | 8/2006 | Kurosawa et al. |
| 2006/0197216 A1 | 9/2006 | Yee |
| 2006/0197217 A1 | 9/2006 | Yee |
| 2006/0264029 A1 | 11/2006 | Heck et al. |
| 2006/0278898 A1 | 12/2006 | Shibayama |
| 2006/0278997 A1 | 12/2006 | Gibson et al. |
| 2006/0292866 A1 | 12/2006 | Borwick et al. |
| 2007/0035020 A1 | 2/2007 | Umemoto |
| 2007/0045779 A1 | 3/2007 | Hiatt |
| 2007/0052050 A1 | 3/2007 | Dierickx |
| 2007/0096295 A1 | 5/2007 | Burtzlaff et al. |
| 2007/0126085 A1 | 6/2007 | Kawano et al. |
| 2007/0194427 A1 | 8/2007 | Choi et al. |
| 2007/0231966 A1 | 10/2007 | Egawa |
| 2007/0249095 A1 | 10/2007 | Song et al. |
| 2007/0262464 A1 | 11/2007 | Watkins et al. |
| 2007/0269931 A1 | 11/2007 | Chung et al. |
| 2007/0290300 A1 | 12/2007 | Kawakami |
| 2008/0002460 A1 | 1/2008 | Tuckerman et al. |
| 2008/0020898 A1 | 1/2008 | Pyles et al. |
| 2008/0032448 A1 | 2/2008 | Simon et al. |
| 2008/0076195 A1 | 3/2008 | Shiv |
| 2008/0079779 A1 | 4/2008 | Cornell et al. |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0111213 A1 | 5/2008 | Akram et al. |
| 2008/0116544 A1 | 5/2008 | Grinman et al. |
| 2008/0136038 A1 | 6/2008 | Savastiouk et al. |
| 2008/0150089 A1 | 6/2008 | Kwon et al. |
| 2008/0157273 A1 | 7/2008 | Giraudin et al. |
| 2008/0164574 A1 | 7/2008 | Savastiouk et al. |
| 2008/0185719 A1 | 8/2008 | Cablao et al. |
| 2008/0230923 A1 | 9/2008 | Jo et al. |
| 2008/0246136 A1 | 10/2008 | Haba et al. |
| 2008/0274589 A1 | 11/2008 | Lee et al. |
| 2008/0284041 A1 | 11/2008 | Jang et al. |
| 2009/0014843 A1 | 1/2009 | Kawashita et al. |
| 2009/0026566 A1 | 1/2009 | Oliver et al. |
| 2009/0032951 A1 | 2/2009 | Andry et al. |
| 2009/0032966 A1 | 2/2009 | Lee et al. |
| 2009/0039491 A1 | 2/2009 | Kim et al. |
| 2009/0045504 A1 | 2/2009 | Suh |
| 2009/0065907 A1 | 3/2009 | Haba et al. |
| 2009/0085208 A1 | 4/2009 | Uchida |
| 2009/0133254 A1 | 5/2009 | Kubota et al. |

(56) References Cited

U.S. PATENT DOCUMENTS

| | | | |
|---|---|---|---|
| 2009/0134498 | A1 | 5/2009 | Ikeda et al. |
| 2009/0148591 | A1 | 6/2009 | Wang et al. |
| 2009/0212381 | A1 | 8/2009 | Crisp et al. |
| 2009/0224372 | A1 | 9/2009 | Johnson |
| 2009/0263214 | A1 | 10/2009 | Lee et al. |
| 2009/0267183 | A1 | 10/2009 | Temple et al. |
| 2009/0294983 | A1 | 12/2009 | Cobbley et al. |
| 2009/0309235 | A1 | 12/2009 | Suthiwongsunthorn et al. |
| 2010/0013060 | A1 | 1/2010 | Lamy et al. |
| 2010/0038778 | A1 | 2/2010 | Lee et al. |
| 2010/0117242 | A1 | 5/2010 | Miller et al. |
| 2010/0127346 | A1 | 5/2010 | DeNatale et al. |
| 2010/0148371 | A1 | 6/2010 | Kaskoun et al. |
| 2010/0155940 | A1 | 6/2010 | Kawashita et al. |
| 2010/0159699 | A1 | 6/2010 | Takahashi |
| 2010/0164062 | A1 | 7/2010 | Wang et al. |
| 2010/0167534 | A1 | 7/2010 | Iwata |
| 2010/0193964 | A1 | 8/2010 | Farooq et al. |
| 2010/0225006 | A1 | 9/2010 | Haba et al. |
| 2010/0230795 | A1 | 9/2010 | Kriman et al. |
| 2010/0258917 | A1 | 10/2010 | Lin |
| 2011/0089573 | A1 | 4/2011 | Kurita |
| 2011/0266674 | A1 | 11/2011 | Hsia et al. |
| 2012/0018863 | A1 | 1/2012 | Oganesian et al. |
| 2012/0018868 | A1 | 1/2012 | Oganesian et al. |
| 2012/0018893 | A1 | 1/2012 | Oganesian et al. |
| 2012/0018894 | A1 | 1/2012 | Oganesian et al. |
| 2012/0018895 | A1 | 1/2012 | Oganesian et al. |
| 2012/0068330 | A1 | 3/2012 | Oganesian et al. |
| 2012/0068352 | A1 | 3/2012 | Oganesian et al. |

FOREIGN PATENT DOCUMENTS

| | | |
|---|---|---|
| EP | 1482553 A2 | 12/2004 |
| EP | 1519410 A1 | 3/2005 |
| EP | 1551060 A1 | 7/2005 |
| EP | 1619722 A1 | 1/2006 |
| EP | 1653510 A2 | 5/2006 |
| EP | 1653521 A1 | 5/2006 |
| EP | 1686627 A1 | 8/2006 |
| JP | 60160645 A | 8/1985 |
| JP | 1106949 A | 4/1989 |
| JP | 4365558 A | 12/1992 |
| JP | 11016949 A | 1/1999 |
| JP | 11195706 A | 7/1999 |
| JP | 2001085559 A | 3/2001 |
| JP | 2001-217386 A | 8/2001 |
| JP | 2002162212 A | 6/2002 |
| JP | 2002217331 A | 8/2002 |
| JP | 2002373957 A | 12/2002 |
| JP | 2003318178 A | 11/2003 |
| JP | 2004165602 A | 6/2004 |
| JP | 2004200547 A | 7/2004 |
| JP | 2005026405 A | 1/2005 |
| JP | 2005093486 A | 4/2005 |
| JP | 2005101268 A | 4/2005 |
| JP | 2007053149 A | 3/2007 |
| JP | 2007157844 A | 6/2007 |
| JP | 2007317887 A | 12/2007 |
| JP | 2008-091632 A | 4/2008 |
| JP | 2008-177249 A | 7/2008 |
| JP | 2008227335 A | 9/2008 |
| JP | 2008-258258 A | 10/2008 |
| JP | 2010-028601 A | 2/2010 |
| KR | 19990088037 | 12/1999 |
| KR | 20040066018 A | 7/2004 |
| KR | 20060009407 A | 1/2006 |
| KR | 2006-0020822 A | 3/2006 |
| KR | 20070065241 A | 6/2007 |
| KR | 100750741 B1 | 8/2007 |
| KR | 20100087566 A | 8/2010 |
| TW | 200406884 A | 5/2004 |
| TW | 200522274 A | 7/2005 |
| TW | 200535435 A | 11/2005 |
| WO | 03/025998 A2 | 3/2003 |
| WO | 2004114397 | 12/2004 |
| WO | 2008/054660 A2 | 5/2008 |
| WO | 2009023462 A1 | 2/2009 |
| WO | 2009104668 A1 | 8/2009 |
| WO | 2010104637 A1 | 9/2010 |

OTHER PUBLICATIONS

International Search Report and Written Opinion for Application No. PCT/US2011/029394 dated Jun. 6, 2012.
International Search Report and Written Opinion for Application No. PCT/US2011/060553 dated Oct. 26, 2012.
International Search Report and Written Opinion, PCT/US2011/063025, Mar. 19, 2012.
International Search Report Application No. PCT/US2011/029568, dated Aug. 30, 2011.
International Search Report Application No. PCT/US2011/029568, dated Oct. 21, 2011.
International Searching Authority, Search Report for Application No. PCT/US2011/060553 dated Jun. 27, 2012.
International Written Opinion for Application No. PCT/US2011/063653 dated Jan. 14, 2013.
Japanese Office Action for Application No. 2009-552696 dated Aug. 14, 2012.
Japanese Office Action for Application No. 2010-519953 dated Oct. 19, 2012.
Partial International Search Report for Application No. PCT/US2011/063653 dated Jul. 9, 2012.
Taiwan Office Action for Application No. 100113585 dated Jun. 5, 2012.
Partial International Search Report, PCT/US2008/002659, date: 2008.
International Search Report, PCT/US2008/002659, Oct. 17, 2008.
PCT/US08/09207, "Reconstituted Wafer Stack Packaging With After Applied Pad Extensions," filed Jul. 25, 2008.
International Search Report and Written Opinion, PCT/US2008/009356 dated Feb. 19, 2009.
International Search Report and Written Opinion, PCT/US2010/002318, dated Nov. 22, 2010.
International Search Report and Written Opinion, PCT/US2010/052458, dated Jan. 31, 2011.
Supplementary European Search Report, EP 08795005 dated Jul. 5, 2010.
International Search Report, PCT/US10/52783, Dated Dec. 10, 2010.
International Search Report and Written Opinion, PCT/US2010/052785, Dated Dec. 20, 2010.
International Search Report and Written Opinion for PCT/US2011/051552 dated Apr. 11, 2012.
International Search Report and Written Opinion for PCT/US2011/051556 dated Feb. 13, 2012.

* cited by examiner

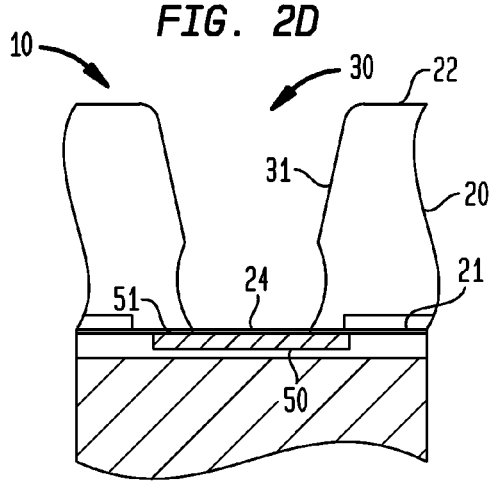
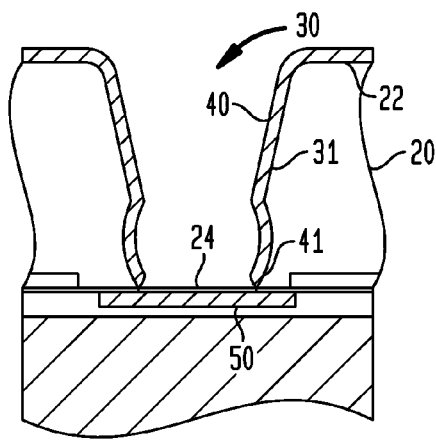
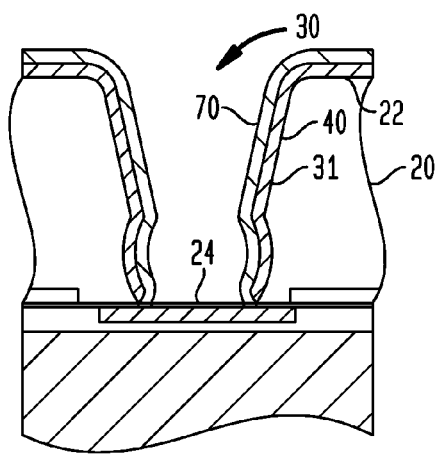

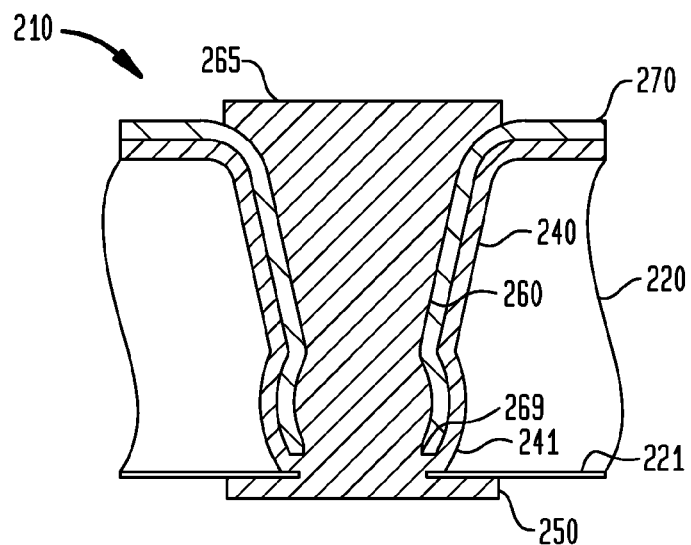
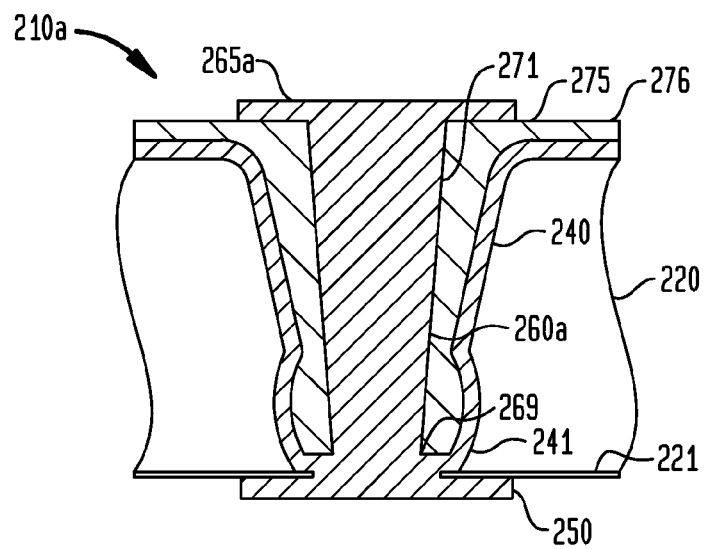

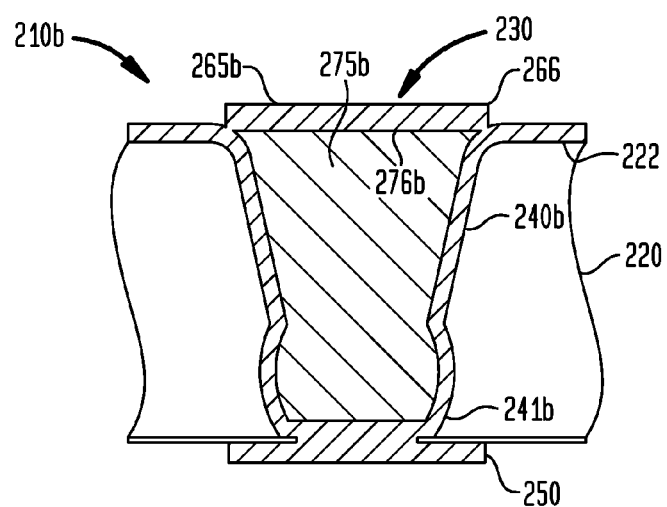
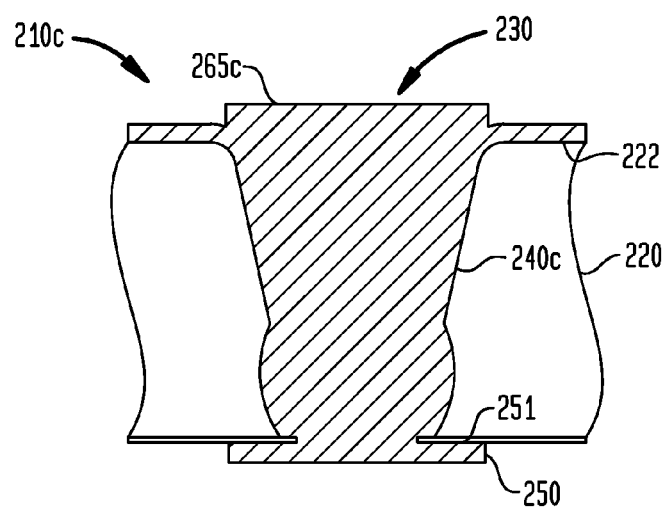

MULTI-FUNCTION AND SHIELDED 3D INTERCONNECTS

BACKGROUND OF THE INVENTION

The present invention relates to packaging of microelectronic devices, especially the packaging of semiconductor devices.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 µm thick. The bond pads could include a single layer or multiple layers of metal. The size of the bond pads will vary with the device type but will typically measure tens to hundreds of microns on a side.

Through-silicon vias (TSVs) are used to connect the bond pads with a second face of the semiconductor chip opposite the first face (e.g., a rear surface). A conventional via includes a hole penetrating through the semiconductor chip and a conductive material extending through the hole from the first face to the second face. The bond pads may be electrically connected to vias to allow communication between the bond pads and conductive elements on the second face of the semiconductor chip.

Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Conventional vias may have reliability challenges because of a non-optimal stress distribution inside of the vias and a mismatch of the coefficient of thermal expansion (CTE) between a semiconductor chip, for example, and the structure to which the chip is bonded. For example, when conductive vias within a semiconductor chip are insulated by a relatively thin and stiff dielectric material, significant stresses may be present within the vias. In addition, when the semiconductor chip is bonded to conductive elements of a polymeric substrate, the electrical connections between the chip and the higher CTE structure of the substrate will be under stress due to CTE mismatch.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via formation and interconnection, further improvements can still be made.

SUMMARY OF THE INVENTION

In accordance with an aspect of the invention, a microelectronic unit can include a semiconductor element consisting essentially of semiconductor material and having a front surface, a rear surface, a plurality of active semiconductor devices adjacent the front surface, a plurality of conductive pads exposed at the front surface, and an opening extending through the semiconductor element. At least one of the conductive pads can at least partially overlie the opening and can be electrically connected with at least one of the active semiconductor devices. The microelectronic unit can also include a first conductive element exposed at the rear surface for connection with an external component. The first conductive element can extend through the opening and can be electrically connected with the at least one conductive pad. The microelectronic unit can also include a second conductive element extending through the opening and insulated from the first conductive element. The at least one conductive pad can overlie a peripheral edge of the second conductive element.

In a particular embodiment, the second conductive element can be connectable to a reference potential. In one embodiment, the first and second conductive elements can be arranged to permit a desired impedance to be achieved for carrying a signal by the first conductive element. In an exemplary embodiment, the first and second conductive elements can be arranged to improve electrical parasitics such as reducing cross-talk or improving signal to noise ratio. In a particular embodiment, the opening can extend completely through a thickness of the semiconductor element. In one embodiment, the first and second conductive elements can be arranged to permit a desired impedance to be achieved for a signal carried by the first conductive element. In an exemplary embodiment, the at least one conductive pad can have an inwardly-facing surface remote from the exposed surface of the conductive pad, and the edge of the second conductive element can be disposed below a height defined by the inwardly-facing surface of the conductive pad.

In one embodiment, the second conductive element can extend along an interior surface of the opening and the first conductive element can be separated from the second conductive element by a thickness of a dielectric layer therebetween. In a particular embodiment, the dielectric layer can include an aperture exposing the at least one conductive pad. The aperture can have a contour that at least does not fully conform to a contour of the interior surface of the opening. The first conductive element can be disposed in the aperture. In an exemplary embodiment, the second conductive element can contact an interior surface of the opening. In one embodiment, the second conductive element can be deposited onto the interior surface of the opening. In a particular embodiment, the second conductive element can be deposited by at least one of plating, physical and/or chemical vapor deposition, physical and/or chemical plasma deposition, a Bosch process, and atomic layer deposition.

In an exemplary embodiment, the second conductive element can at least substantially surround the first conductive element. In one embodiment, the second conductive element can conform to a contour of an interior surface of the opening. In a particular embodiment, a dielectric layer between the first and second conductive elements can have a surface which conforms to a contour of a surface of the interior surface of the opening. The first conductive element can be formed on the surface of the dielectric layer, such that the first conductive element can conform to a contour of the interior surface of the opening. In an exemplary embodiment, the second conductive element can be separated from the at least one conductive pad by at least one dielectric layer disposed therebetween. In one embodiment, the first conductive element can include a contact portion exposed at the rear surface. The contact portion can at least partially overlie the at least one conductive pad to which it is electrically connected.

In a particular embodiment, the contact portion can fully overlie the at least one conductive pad to which it is electrically connected. In an exemplary embodiment, the first conductive element can fill a volume between surfaces of a dielectric layer within the opening. In one embodiment, the conductive pads and the first and second conductive elements can be adapted for electrical interconnection with a component external to the microelectronic unit. In a particular embodiment, the second conductive element can include a plurality of metal layers of differing composition.

In one embodiment, the opening in the semiconductor element can include a first opening extending from the rear surface towards the front surface and can include a hole extending from the first opening to the at least one conductive pad. The first opening and the hole can meet at a combined aperture having a first width. The hole can have a second width smaller than the first width where the hole meets the at least one conductive pad. In an exemplary embodiment, the first opening can have a first width in a lateral direction along the rear surface. The hole can have a second width in the lateral direction where the hole meets the first opening. The hole can have a third width in the lateral direction adjacent the conductive pad. The first width can be greater than the second width, and the second width can be greater than the third width. In a particular embodiment, the microelectronic unit can also include a third conductive element extending through a second opening and electrically connected to a second conductive pad. The third conductive element can be connectable to a reference potential.

In an exemplary embodiment, the opening in the semiconductor element can be at least partly aligned with at least two of the plurality of conductive pads and the second conductive element can extend along an interior surface of the opening adjacent to the at least two conductive pads. In one embodiment, the microelectronic unit can include a plurality of the first conductive elements, each electrically connected to a respective one of the at least two conductive pads and exposed at the rear surface. In a particular embodiment, the second conductive element can be connectable to a reference potential. In an exemplary embodiment, the second conductive element and the plurality of the first conductive elements can be arranged to permit a desired impedance to be achieved for carrying signals by the first conductive elements.

In accordance with an aspect of the invention, a microelectronic unit can include a semiconductor element consisting essentially of semiconductor material and having a front surface, a rear surface, a plurality of active semiconductor devices adjacent the front surface, a plurality of conductive pads exposed at the front surface, and an opening extending through the semiconductor element. A first one of the conductive pads can at least partially overlie the opening and can be electrically connected with at least one of the active semiconductor devices. The microelectronic unit can also include a first conductive element exposed at the rear surface for connection with an external component. The first conductive element can extend through the opening and can be electrically connected with the first conductive pad. The microelectronic unit can also include a second conductive element extending through the opening and directly contacting a surface of the semiconductor material within the opening. The second conductive element can be insulated from the first conductive element. The second conductive element can be exposed at the rear surface for connection with an external component. The second conductive element can extend through the opening and can be electrically connected with a second one of the conductive pads.

In a particular embodiment, the opening in the semiconductor element can be at least partly aligned with the first and second conductive pads. The second conductive element can extend along an interior surface of the opening. The first conductive element can extend along a surface of the second conductive element within the opening. In one embodiment, the second conductive element can be connectable to a reference potential. In an exemplary embodiment, the first and second conductive elements can be arranged to permit a desired impedance to be achieved for carrying a signal by the first conductive element.

In accordance with an aspect of the invention, a component can include a passive element consisting essentially of at least one of semiconductor or dielectric material and having a front surface, a rear surface, a plurality of conductive pads exposed at the front surface, and an opening extending through the semiconductor element. At least one of the conductive pads can at least partially overlie the opening and can be electrically connected with at least one of the active semiconductor devices. The component can also include a first conductive element exposed at the rear surface for connection with an external component. The first conductive element can extend through the opening and can be electrically connected with the at least one conductive pad. The component can also include a second conductive element extending through the opening and insulated from the first conductive element. The at least one conductive pad can overlie a peripheral edge of the second conductive element.

In an exemplary embodiment, the second conductive element can be connectable to a reference potential. In a particular embodiment, the passive element can have a plurality of passive circuit elements thereon. In one embodiment, the passive element can consist essentially of glass. In an exemplary embodiment, the passive element can consist essentially of silicon. In a particular embodiment, the conductive pads and the first and second conductive elements can be adapted for electrical interconnection with a device external to the component.

In accordance with an aspect of the invention, a method of forming a component can include forming an opening extending from a rear surface of an element towards a front surface remote therefrom. The element can consist essentially of a nonconductive or semiconductor material and can have a conductive pad at least partly overlying the opening. The method can also include forming a first conductive element overlying an interior surface of the opening and overlying at least a portion of the rear surface. The method can also include forming a dielectric layer overlying the first conductive element. The method can also include forming a second conductive element electrically connected with the conductive pad. The second conductive element can be exposed at the rear surface and can be insulated from the first conductive element by the dielectric layer. The conductive pad can overlie a peripheral edge of the first conductive element. The first and second conductive elements can be arranged to achieve a desired impedance.

In one embodiment, the first conductive element can improve a deposition of the dielectric layer. In a particular embodiment, the step of forming the dielectric layer can be performed by electrochemical deposition of a dielectric material. In an exemplary embodiment, the first conductive element can be connected to a reference potential, and the second conductive element can be adapted for carrying a signal. In one embodiment, the step of forming the first conductive element can include depositing a metal layer in contact with semiconductor material exposed at the interior surface of the opening. In a particular embodiment, the step of forming the dielectric layer can be performed so that the dielectric layer conforms to a contour of the interior surface of the opening. In an exemplary embodiment, the step of forming the second conductive element can be performed by depositing a metal onto a surface of the dielectric layer within the opening so that the second conductive element can conform to a contour of the interior surface of the opening.

In a particular embodiment, the step of forming the second conductive element can be performed by filling a volume within the opening with a metal. The volume can be bounded by a surface of the dielectric layer. In an exemplary embodiment, the step of forming the dielectric layer can be performed by filling a volume within the opening with a dielectric material. The volume can be bounded by a surface of the first conductive element. The step of forming the second conductive element can be performed by forming an aperture extending through the dielectric layer and exposing the inner surface of the conductive pad, the aperture not conforming to a contour of the interior surface of the opening, and then forming the second conductive element within the aperture. In one embodiment, the method can also include forming a hole extending through the conductive pad to the opening. The step of forming the dielectric layer can be performed so that the dielectric layer contacts an exposed inner surface of the conductive pad. The step of forming the second conductive element can be performed so that the second conductive element extends through the hole and contacts the conductive pad at least at an outwardly-facing surface thereof.

In an exemplary embodiment, the step of forming the opening can include removing semiconductor material therefrom until a dielectric layer between the opening and the conductive pad becomes at least partly exposed. The step of forming the first conductive element can include depositing a metal onto the interior surface of the opening and the at least a portion of the rear surface. The step of forming the second conductive element can include removing a portion of the dielectric layer exposed within the opening, and then depositing a metal within the opening. In one embodiment, the step of forming the first conductive element can include selectively depositing the metal onto the semiconductor material exposed within the opening and the at least a portion of the rear surface. In a particular embodiment, the step of forming the first conductive element can include electroplating the metal selectively onto the semiconductor material. In an exemplary embodiment, the step of forming the first conductive element can include selectively treating a surface of the semiconductor material exposed within the opening with a laser. In one embodiment, the step of forming the first conductive element can include non-selectively depositing the metal within the opening. The method can also include removing at least a portion of the deposited metal at least partially overlying the dielectric layer.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF THE DRAWINGS

FIGS. 2A-2H are sectional views illustrating stages of fabrication in accordance with the embodiment of the invention depicted in FIG. 1.

FIG. 8 is a sectional view illustrating a via structure in accordance with another embodiment.

FIG. 9 is a sectional view illustrating a via structure in accordance with another embodiment.

FIG. 10 is a sectional view illustrating a via structure in accordance with another embodiment.

FIG. 11 is a sectional view illustrating a via structure in accordance with another embodiment.

DETAILED DESCRIPTION

Figure 1:
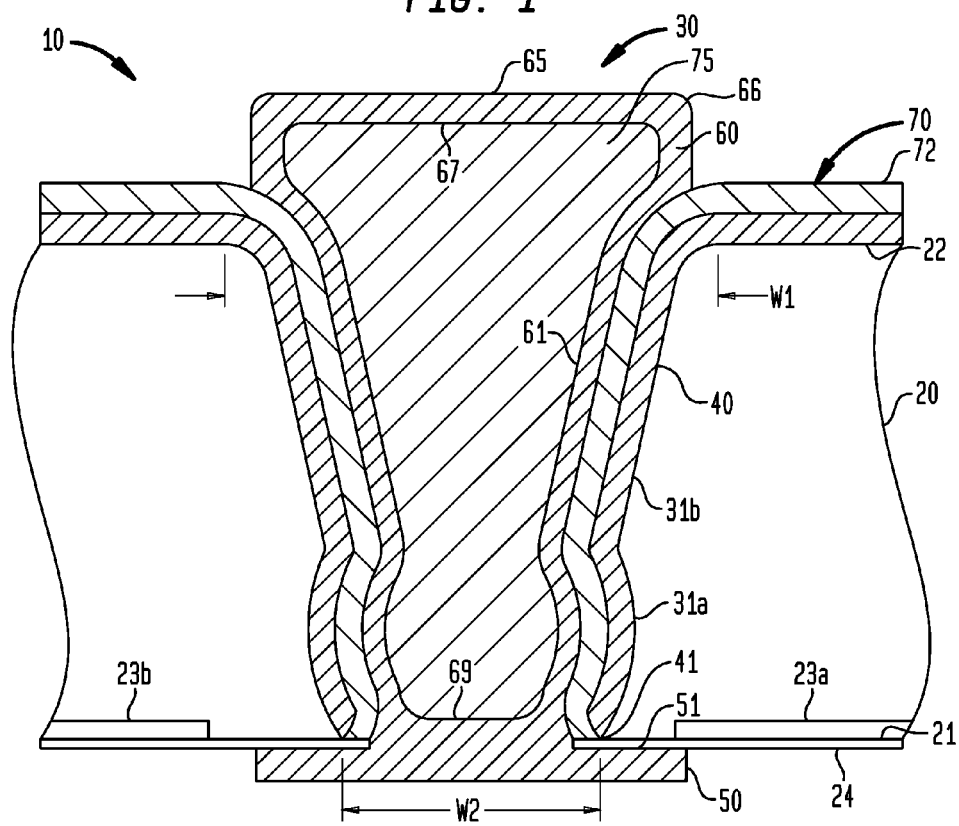
FIG. 1 is a sectional view illustrating a via structure in accordance with an embodiment of the invention.

FIG. 1 is a sectional view illustrating a via structure in accordance with an embodiment of the invention. As illustrated in FIG. 1, a microelectronic unit 10 includes a semiconductor element 20 having an opening 30 extending from a rear surface 22 through the semiconductor element 20 to a front surface 21 remote from the rear surface.

In FIG. 1, the directions parallel to front surface are referred to herein as "horizontal" or "lateral" directions; whereas the directions perpendicular to the front surface are referred to herein as upward or downward directions and are also referred to herein as the "vertical" directions. The directions referred to herein are in the frame of reference of the structures referred to. Thus, these directions may lie at any orientation to the normal or gravitational frame of reference.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

A conductive layer 40 overlies inner surfaces 31a, 31b of the opening 30 and extends along the rear surface 22. As shown in FIG. 1, the conductive layer can contact the semiconductor material exposed at surfaces 31a, 31b and the conductive layer can extend along surfaces 31a, 31b and conform to contours of the surfaces. A conductive pad 50 can be exposed at the front surface 21 and may at least partially overlie the opening 30. In a particular embodiment, the conductive pad 50 can be only partially exposed at the front surface 21. A conductive interconnect 60 extends within the opening 30 from an inward-facing surface 51 of the conductive pad 50 to lateral edges 66 of a conductive contact 65 exposed at the rear surface 22 that can serve as a contact for electrical connection with an external device. The conductive interconnect 60 contacts the inward-facing surface 51 at a bottom surface 69 thereof.

A dielectric layer 24 (e.g., a "passivation layer") extends along the front surface 21 and electrically insulates the conductive pad 50 from the front surface and the conductive layer 40. A dielectric layer 70 overlies the conductive layer 40 inside of the opening 30 and along the rear surface 22. The dielectric layer 70 electrically insulates the conductive layer 40 from the conductive interconnect 60. A dielectric region 75 occupies the volume between the inner surfaces 61 of the conductive interconnect 60 and an inward-facing surface 67 of the conductive contact 65.

The semiconductor element 20 can include a semiconductor substrate, which can be made from silicon, for example. A plurality of active semiconductor devices (e.g., transistors, diodes, etc.) can be disposed in active semiconductor regions 23a and 23b thereof located at and/or below the front surface 21. The conductive pad 50 can overlie the semiconductor region 23a, and the conductive pad 50 can be laterally separated from the semiconductor region 23b. The plurality of active semiconductor devices can be electrically connected to the conductive pad 50 for interconnection to other internal and/or external components. The thickness of the semiconductor element 20 between the front surface 21 and the rear surface 22 typically is less than 200 μm, and can be significantly smaller, for example, 130 μm, 70 μm, 50 μm, or even smaller.

In any of the via structure embodiments described herein, the semiconductor element 20 may be replaced by a nonconductive interposer element, such as a glass substrate or any other dielectric material. In such interposer embodiments having a nonconductive element, there may not be any active semiconductor devices located therein. In such embodiments, the microelectronic unit 10 may be a component that is a circuit element, and the conductive layer 40 and the conductive interconnect 60 may be adapted for electric interconnection with an element external to the component.

The dielectric layer 24 can be located between the front surface 21 and the conductive pad 50. The dielectric layer 24 electrically insulates the conductive pad 50 from the semiconductor element 20 and the conductive layer 40. This dielectric layer 24 can be referred to as a "passivation layer" of the microelectronic unit 10. The dielectric layer 24 can include an inorganic or organic dielectric material or both. The dielectric layer 24 may include an electrodeposited conformal coating or other dielectric material, for example, a photoimageable polymeric material, for example, a solder mask material. The dielectric layer 24 may include one or more layers of oxide material or other dielectric material.

Figure 5:
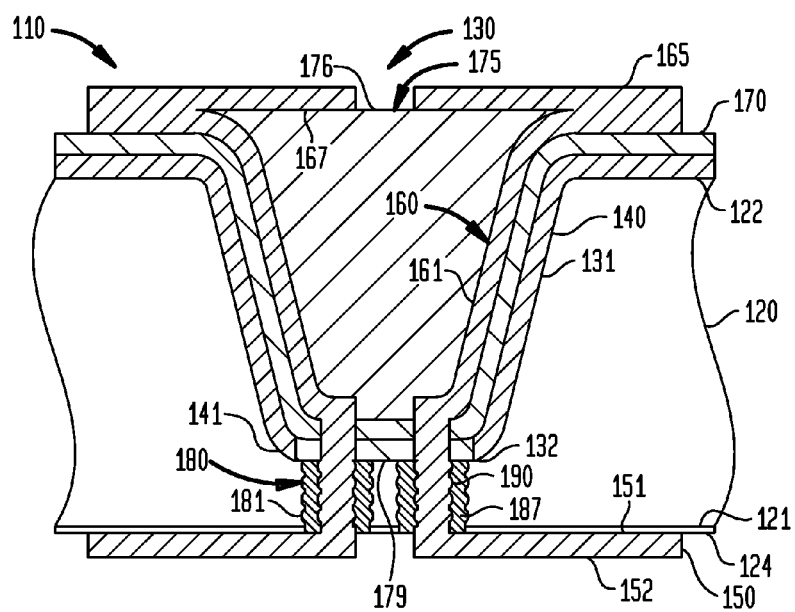
FIG. 5 is a sectional view illustrating a via structure in accordance with another embodiment.

The opening 30 extends from the rear surface 22 through the semiconductor element 20 to an inward-facing surface 51 of a conductive pad 50 exposed at the front surface 21. The opening 30 includes inner surfaces 31 that extend from the rear surface 22 through the semiconductor element 20 at an angle between 0 and 90 degrees to the horizontal plane defined by the rear surface 22. The inner surface 31 can have a constant slope (e.g., as shown in FIG. 5) or a varying slope (e.g., as shown in FIG. 1). For example, the angle or slope of the inner surface 31 relative to the horizontal plane defined by the rear surface 22 can decrease in magnitude (i.e., become less positive or less negative) as the inner surface 31 penetrates further towards the front surface 21.

As shown in FIG. 1, the opening 30 has a width W1 at the rear surface 22 and a width W2 at the front surface 31 that is less than the width W1 such that the opening is tapered in a direction from the rear surface towards the front surface. In other examples, the opening can have a constant width, or the opening can be tapered in a direction from the front surface towards the rear surface. The opening 30 may partially extend from the rear surface 22 towards the front surface 21, such the opening can be connected to the conductive pad 50 through one or more holes extending therebetween (e.g., as shown in FIG. 5).

The opening 30 can have any top-view shape, including for example, an oval shape, a square shape, or a rectangular channel with a plurality of conductive interconnects extending therethrough to respective conductive pads at the front surface of the semiconductor element (not shown). In one embodiment, such as in the embodiment shown in FIG. 6, the opening can have a round top-view shape. In particular embodiments, the opening can have any three-dimensional shape, including for example, a cylinder, a cube, or a prism, among others.

The conductive layer 40 can be made from any electrically conductive metal, including for example, titanium, tungsten, copper, or gold. The conductive layer 40 extends from the rear surface 22 into the opening 30, and the conductive layer 40 extends to lower ends 41 that are electrically insulated from the inward-facing surface 51 of the conductive pad 50 by one or more of the dielectric layer 24, the dielectric layer 70, or any other dielectric material.

The conductive layer 40 can coat most of the rear surface 22 of the semiconductor element 20. The conductive layer 40 may be a continuous layer electrically connected to a reference ground, or the conductive layer may be split with some or all of the areas thereof attached to ground or power. The conductive layer 40 can serve to electrically shield the conductive interconnects 60 that can carry input and/or output signals, such that the microelectronic unit 10 can experience less signal noise. The conductive layer 40 can spread heat across the semiconductor element 20, which can result in improved thermal performance compared to a semiconductor element without such a conductive layer.

In all of the embodiments described herein, a conductive element that is adapted to be electrically connected to a reference ground input/output (e.g., the conductive layer 40) need not be connected to a single static voltage. Instead of a reference ground, such a conductive element as the conductive layer 40 can be electrically connected to a voltage that can float within a desired voltage range. Such a conductive element as the conductive layer 40 need only be insulated from electrical connection with a conductive element that is adapted to be electrically connected to an input and/or output signal (e.g., the conductive interconnect 60). In an exemplary embodiment, a conductive element that is adapted to be electrically connected to a reference ground (e.g., the conductive layer 40) can be electrically connected to a power input/output. In a particular embodiment, a conductive element that is adapted to be electrically connected to a reference ground (e.g., the conductive layer 40) and a conductive element that is adapted to be electrically connected to an input and/or output signal (e.g., the conductive interconnect 60) can be arranged to permit a desired impedance to be achieved.

The presence of a conductive layer 40 can allow the dielectric layer 70 (or another conductive layer) to be deposited thereon with less process variability (e.g., when using an electrochemical deposition process) than if the dielectric layer was deposited directly onto a substrate element (in place of the semiconductor element 20) such as glass.

While essentially any technique usable for forming conductive elements can be used to form the conductive elements described herein, non-lithographic techniques as discussed in greater detail in the co-pending U.S. patent application Ser. No. 12/842,669, filed on Jul. 23, 2010, can be employed. Such non-lithographic techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

The semiconductor element 20 includes one or more conductive pads 50 exposed at or located at the front surface 21 of the semiconductor element 20. While not specifically shown in FIG. 1, the active semiconductor devices in the active semiconductor regions 23a and 23b typically are conductively connected to the conductive pads 50. The active semiconductor devices, thus, are accessible conductively through wiring incorporated extending within or above one or more dielectric layers of the semiconductor element 20.

In some embodiments, the conductive pads may not be directly exposed at the front surface of the semiconductor element. Instead, the conductive pads may be electrically connected to traces or other conductive elements extending to terminals that are exposed at the front surface of the semiconductor element. The conductive pads 50 can be made from any electrically conductive metal, including for example, copper or gold. The conductive pads 50 and any of the conductive pads disclosed herein can have any top-view shape, including a square, round, oval, triangle, rectangle, or any other shape.

As used in this disclosure, a statement that an electrically conductive element is "exposed at" a surface of a dielectric element indicates that the electrically conductive element is available for contact with a theoretical point moving in a direction perpendicular to the surface of the dielectric element toward the surface of the dielectric element from outside the dielectric element. Thus, a terminal or other conductive element which is exposed at a surface of a dielectric element may project from such surface; may be flush with such surface; or may be recessed relative to such surface and exposed through a hole or depression in the dielectric.

The conductive interconnect 60 extends within the opening 30 and is electrically connected with the conductive pad 50. As shown in FIG. 1, the conductive interconnect 60 includes an internal space that is filled with a dielectric region 75. In exemplary embodiments, the conductive interconnect 60 can be solid, left open, left open and coated with a dielectric layer, or filled with a second conductive material. The conductive interconnect 60 can be made from any electrically conductive metal, including for example, copper or gold.

The conductive contact 65 joined at its lateral edges 66 to the conductive interconnect 60 and is exposed at the outer surface 72 of the dielectric layer 70 for interconnection to an external element. As shown, the conductive contact 65 is located above a plane defined by the outer surface 72 of the dielectric layer 70 and above a plane defined by the rear surface 22 of the semiconductor element 20. In other embodiments, the conductive contact 65 can be located at or below the plane defined by the outer surface 72 of the dielectric layer 70, and/or the conductive contact can be located at or below the plane defined by the rear surface 22. The conductive contact 65 can be planarized to the outer surface 72 of the dielectric layer 70 or the rear surface 22, for example, by a grinding, lapping, or polishing process.

In some embodiments, conductive bond material can be exposed at the conductive contact 65 or at a surface of another conductive contact exposed at the rear surface of the semiconductor element for interconnection with an external device.

Figure 2A:
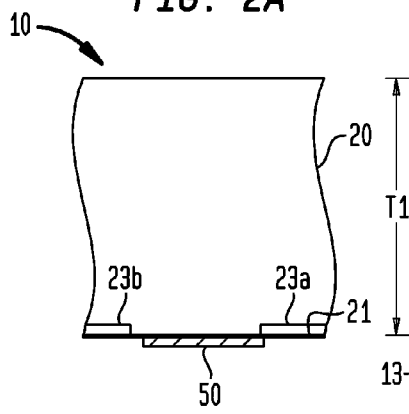

A method of fabricating the microelectronic unit 10 will now be described, with reference to FIGS. 2A-2E. As illustrated in FIG. 2A, the microelectronic unit 10 includes a semiconductor element 20 having one or more active semiconductor regions 23a and/or 23b and having one or more conductive pads 50 exposed at a front surface 21 thereof.

Figure 2B:
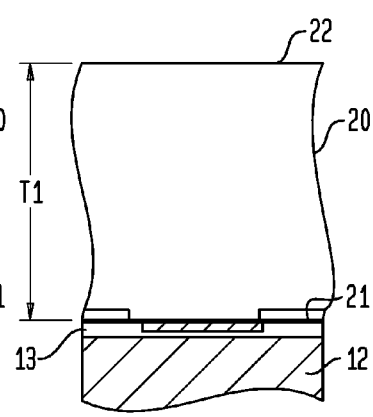

As illustrated in FIG. 2B, a support wafer 12 is temporarily attached to the front surface 21 of the semiconductor element 20 by an adhesive layer 13 to provide additional structural support to the semiconductor element during processing of the rear surface 22.

Figure 2C:
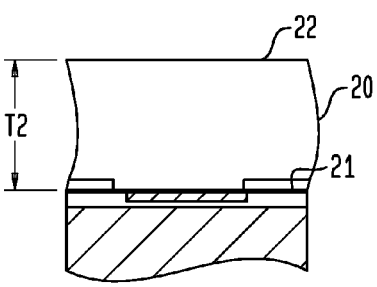

Thereafter, as illustrated in FIG. 2C, the thickness of the semiconductor element 20 between the front surface 21 and the rear surface 22 can be reduced. Grinding, lapping, or polishing of the rear surface or a combination thereof can be used to reduce the thickness. During this step, as an example, the initial thickness T1 (shown in FIG. 2B) of the semiconductor element 20 can be reduced from about 700 μm to a thickness T2 (shown in FIG. 7G) of about 50 μm or less.

Thereafter, as illustrated in FIG. 2D, the opening 30 can be formed extending downwardly from the rear surface 22 of the semiconductor element 20 to the dielectric layer 24 that extends between the front surface 21 and the inwardly-facing surface 51 of the conductive pad 50. The opening 30 can be formed for example, by selectively etching the semiconductor element 20, after forming a mask layer where it is desired to preserve remaining portions of the rear surface 22. For example, a photoimageable layer, e.g., a photoresist layer, can be deposited and patterned to cover only portions of the rear surface 22, after which a timed etch process can be conducted to form the opening 30.

The inner surfaces 31 of the opening 30, extending downwardly from the rear surface 22 to the dielectric layer 24, may be sloped, i.e., may extend at angles other a normal angle (right angle) to the rear surface 22, as shown in FIG. 2D. Wet etching processes, e.g., isotropic etching processes and sawing using a tapered blade, among others, can be used to form openings 30 having sloped inner surfaces 31. Laser dicing, mechanical milling, chemical etching, laser drilling, plasma etching, directing a jet of fine abrasive particles towards the semiconductor element 20, among others, can also be used to form openings 30 (or any other hole or opening described herein) having sloped inner surfaces 31.

Alternatively, instead of being sloped, the inner surfaces of the opening 30 may extend in a vertical or substantially vertical direction downwardly from the rear surface 22 substantially at right angles to the rear surface 22. Anisotropic etching processes, laser dicing, laser drilling, mechanical removal processes, e.g., sawing, milling, ultrasonic machining, directing a jet of fine abrasive particles towards the semiconductor element 20, among others, can be used to form openings 30 having essentially vertical inner surfaces.

In a particular embodiment (not shown), the opening 30 can be located over a plurality of conductive pads 50 located on more than one microelectronic unit 10, such that when the microelectronic units 10 are severed from each other, a portion of the opening 30 will be located on each microelectronic unit 10. As used herein in the specification and in the claims, the term "opening" can refer to a opening that is located entirely within a single microelectronic unit, a opening that extends across a plurality of microelectronic units 10 when it is formed (not shown), or a portion of a opening that is located on a particular microelectronic unit 10 after it is severed from other microelectronic units 10.

Thereafter, as illustrated in FIG. 2E, the conductive layer 40 can be deposited onto the rear surface 22 of the semiconductor element 20 and onto the inner surfaces 31 of the opening 30, such that the shape of the conductive layer 40 conforms to a contour of the rear surface 22 and the inner surfaces 31. The conductive layer 40 is formed extending from the rear surface 22, along the inner surfaces 31 to the dielectric layer 24, such that the lower ends 41 of the conductive layer can abut the dielectric layer but do not contact the conductive pad 50.

To form the conductive layer 40 (and any of the other conductive elements described herein), an exemplary method involves depositing a metal layer by one or more of sputtering a primary metal layer onto the rear surface 22 and the inner surfaces 31a, 31b, or by electroplating, or mechanical deposition. Electroplating can be performed in a selective manner, such as to form a plated metal layer on the surface of the semiconductor material exposed within the opening 30 and on the rear surface 22. In such case, the plated metal layer can be made without contacting the conductive pad, which is insulated from the semiconductor element 20 by the passivation layer 24. Mechanical deposition can involve the directing a stream of heated metal particles at high speed onto the surface to be coated. This step can be performed by blanket deposition onto the rear surface 22 and the inner surfaces 31, for example. In one embodiment, the primary metal layer includes or consists essentially of aluminum. In another particular embodiment, the primary metal layer includes or consists essentially of copper. In yet another embodiment, the primary metal layer includes or consists essentially of titanium. One or more other exemplary metals can be used in a process to form the conductive layer 40. In particular examples, a stack including a plurality of metal layers can be formed on one or more of the afore-mentioned surfaces. For example, such stacked metal layers can include a layer of titanium followed by a layer of copper overlying the titanium (Ti—Cu), a layer of nickel followed by a layer of copper overlying the nickel layer (Ni—Cu), a stack of nickel-titanium-copper (Ni—Ti—Cu) provided in similar manner, or a stack of nickel-vanadium (Ni—V), for example.

Thereafter, as illustrated in FIG. 2F, a dielectric layer 70 can be deposited onto the conductive layer 40 overlying the rear surface 22 of the semiconductor element 20 and overlying the inner surfaces 31 of the opening 30. Thus, the dielectric layer 70 conforms to a contour of the conductive layer 40, and, because the conductive layer 40 conforms to a contour of the inner surfaces 31 of the opening 30, the dielectric layer also conforms to a contour of the inner surfaces of the opening. When the dielectric layer 70 is formed, the passivation layer 24 can be present between the dielectric layer 70 and the conductive pad 50.

Various methods can be used to form the dielectric layer 70. In one example, a flowable dielectric material is applied to the conductive layer 40 overlying the rear surface 22, and the flowable material is then more evenly distributed across the rear surface during a "spin-coating" operation, followed by a drying cycle which may include heating. In another example, a thermoplastic film of dielectric material can be applied to the rear surface 22 of after which the semiconductor element is heated, or is heated in a vacuum environment, i.e., placed in an environment under lower than ambient pressure. This then causes the film to flow downward onto the inner surfaces 31 of the opening 30. In another example, vapor deposition can be used to form the dielectric layer 70.

In still another example, the semiconductor element 20 can be immersed in a dielectric deposition bath to form a conformal dielectric coating or dielectric layer 70. As used herein, a "conformal coating" is a coating of a particular material that conforms to a contour of the surface being coated, such as when the dielectric layer 70 conforms to a contour of the conductive layer 40. An electrochemical deposition method can be used to form the conformal dielectric layer 70, including for example, electrophoretic deposition or electrolytic deposition.

In one example, an electrophoretic deposition technique can be used to form the conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric layer 70 on exposed surfaces of the conductive layer 40, including but not limited to overlying the rear surface 22 and the inner surfaces 31. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the assembly (e.g., the conductive layer 40). In addition, the electrophoretic coating can be deposited so that it does not form on pre-existing dielectric layers such as the dielectric layer 24, due to its dielectric (nonconductive) property. Stated another way, a property of electrophoretic deposition is that is does not form on a layer of dielectric material overlying a conductor provided that the layer of dielectric material has sufficient thickness, given its dielectric properties. Typically, electrophoretic deposition will not occur on dielectric layers having thicknesses greater than about 10 microns to a few tens of microns. The conformal dielectric layer 70 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |
| ECOAT NAME | ELECTROLAC | LECTRASEAL DV494 | LECTROBASE 101 |
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric layer can be formed electrolytically. This process is similar to electrophoretic deposition, except that the thickness of the deposited layer is not limited by proximity to the conductive or semiconductive surface from which it is formed. In this way, an electrolytically deposited dielectric layer can be formed to a thickness that is selected based on requirements, and processing time is a factor in the thickness achieved. In a particular example, the passivation layer 24 can be removed before the dielectric layer 70 is formed by electrolytic or electrophoretic deposition onto the conductive layer 40. This is possible because the deposition can be performed selectively onto the exposed surface of the conductive layer 40, without depositing the dielectric layer 70 on the inwardly-facing surface 51 of the conductive pad 50.

Figure 2G:
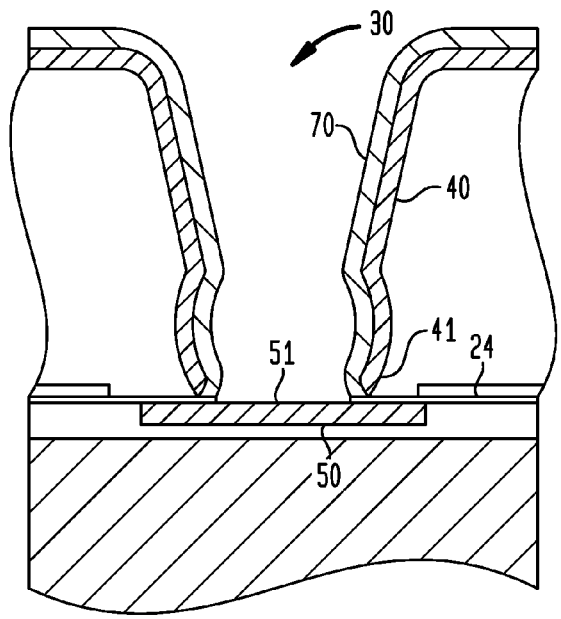

Thereafter, as illustrated in FIG. 2G, an etch process can be conducted in a manner that selectively etches the portion of the dielectric layer 24 (the passivation layer) that is exposed within the opening 30, thereby extending the opening to expose the inwardly-facing surface 51 of the conductive pad 50. Etching, laser drilling, mechanical milling, or other appropriate techniques can be used to remove the portion of the passivation layer 24. The etching of the dielectric layer 24 does not expose the lower ends 41 of the conductive layer 40, such that the lower ends are still insulated from the conductive pad 50 by a remaining portion of the dielectric layer 24 and a portion of the dielectric layer 70.

Other possible dielectric layer removal techniques include various selective etching techniques which can be isotropic or anisotropic in nature. Anisotropic etch processes include reactive ion etch processes in which a stream of ions are directed towards surfaces to be etched. Reactive ion etch processes are generally less selective than isotropic etch processes such that surfaces at which ions strike at high angles of incidence are etched to a greater extent than surfaces which are oriented with the stream of ions. When a reactive ion etch process is used, desirably, a mask layer is desirably deposited to overlie the passivation layer 24 and an opening is formed therein that is aligned with the opening 30. In such a way, the etch process avoids removing portions of the passivation layer 24 other than that which lies within the opening 30.

Figure 2H:
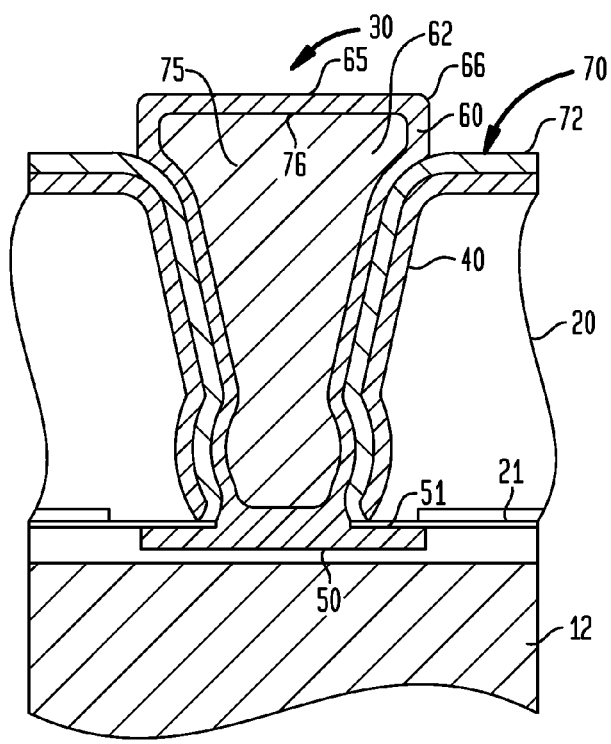

Thereafter, as illustrated in FIG. 2H, the conductive interconnect 60 is deposited into the opening 30 onto the portion of the dielectric layer 70 that is located within the opening and onto the inwardly-facing surface 51 of the conductive pad 50, thereby electrically connecting the conductive interconnect to the conductive pad. The shape of the conductive interconnect 60 conforms to a contour of the outer surface 72 of the dielectric layer 70 and a contour of the inwardly-facing surface 51 of the conductive pad 50. Thus, because the dielectric layer 70 conforms to a contour of the conductive layer 40, and because both the dielectric layer and the conductive layer conform to a contour of the inner surfaces 31 of the opening 30, the conductive interconnect 60 also conforms to a contour of the conductive layer and a contour of the inner surfaces of the opening. The conductive interconnect 60 is deposited onto the outer surface 72 of the dielectric layer 70 such that an internal space 62 is created inside the conductive interconnect.

The conductive interconnect 60 can be formed using one or more of the metal layer deposition processes described above with reference to deposition of the conductive layer 40, for example, an exemplary method involves depositing a metal layer by one or more of sputtering a primary metal layer onto the outer surface 72 and the inwardly-facing surface 51, plating, or mechanical deposition.

Then, the internal space 62 can be filled with a dielectric region 75. Optionally, the dielectric region 75 can be formed such that an exposed outer surface 76 of the dielectric region is parallel to or substantially parallel to the rear surface 22 of the semiconductor element or the exposed portion of the outer surface 72 of the dielectric layer 70. For example, a self-planarizing dielectric material can be deposited in the opening 30, e.g., by a dispensing or stenciling process. In another example, a grinding, lapping, or polishing process can be applied to the exposed outer surface 76 of the dielectric region 75 after forming the dielectric region to planarize the outer surface thereof.

Then, the conductive contact 65 can be formed, for example, by plating the conductive contact onto the outer surface 75 of the dielectric region 75. The conductive contact 65 is exposed at the outer surface 76 of the dielectric region 75 for interconnection with an external device. The conductive contact 65 is electrically connected at its lateral edges 66 to the upper edges of the conductive interconnect 60. After formation of the conductive interconnect 60 and the conductive contact 65, the support wafer 12 can be removed from the front surface 21 of the semiconductor element 20.

Figure 3:
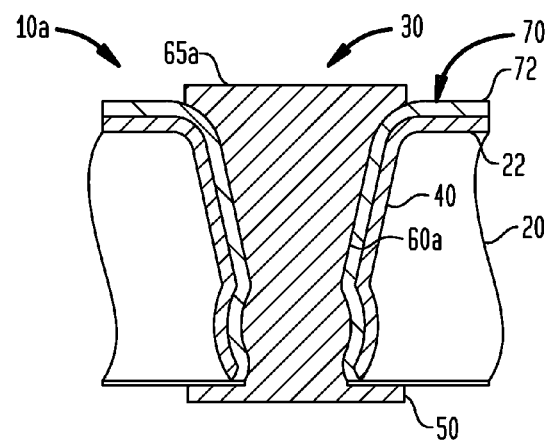
FIG. 3 is a sectional view illustrating a via structure in accordance with another embodiment.

FIG. 3 is a sectional view illustrating a variation of the via structure of FIG. 1 having an alternate conductive interconnect configuration. The microelectronic unit 10a is similar to the microelectronic unit 10 described above, but rather than having a conductive interconnect that is filled with a dielectric region that is surrounded by the conductive interconnect and a conductive contact that is exposed at the rear surface, the microelectronic unit 10a has a solid conductive interconnect 60a that fills all of the volume within the opening 30 that is not occupied by the conductive layer 40 and the dielectric layer 70.

An outwardly-facing surface 65a of the conductive interconnect 60a is exposed at the outer surface 72 of the dielectric layer 70 for interconnection to an external element. In the embodiment shown in FIG. 3, the exposed outwardly-facing surface 65a can be the top surface of the conductive interconnect 60a, i.e., a surface at a furthest extent from the conductive pad 50, or the exposed surface may not be a top surface thereof. As shown, the outwardly-facing surface 65a is located above a plane defined by the outer surface 72 of the dielectric layer 70 and above a plane defined by the rear surface 22 of the semiconductor element 20. In other embodiments, the outwardly-facing surface 65a can be located at or below the plane defined by the outer surface 72 of the dielectric layer 70, and/or the outwardly-facing surface 65a can be located at or below the plane defined by the rear surface 22. The outwardly-facing surface 65a can be planarized to the outer surface 72 of the dielectric layer 70 or the rear surface 22, for example, by a grinding, lapping, or polishing process.

Figure 4:
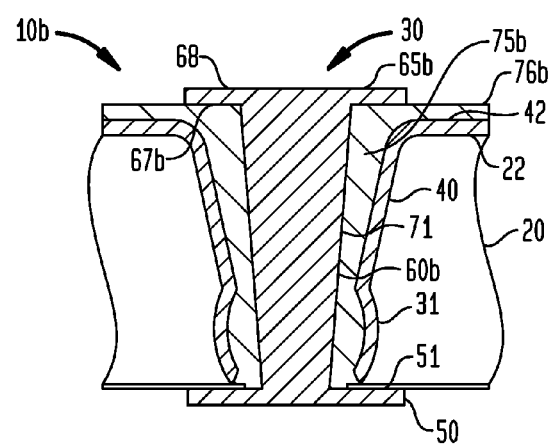
FIG. 4 is a sectional view illustrating a via structure in accordance with another embodiment.

FIG. 4 is a sectional view illustrating another variation of the via structure of FIG. 3 having an alternate conductive interconnect configuration. The microelectronic unit 10b is similar to the microelectronic unit 10a described above, but rather than having a conductive interconnect that fills the space inside of the opening that is not occupied by the conductive layer or the dielectric layer, the microelectronic unit 10b has a conductive interconnect 60b that is deposited into a first aperture 71 formed in a dielectric region 75b located within the opening 30.

The conductive interconnect 60b is not conformal to either a contour of the inner surfaces 31 of the opening 30 or a contour of the conductive layer 40. The microelectronic unit 10b further includes a conductive contact 65b electrically connected to the conductive interconnect 60b. The conductive contact 65b can partially or wholly overlie the inner surfaces 31 of the opening 30.

The dielectric region 75b can provide good dielectric isolation with respect to the conductive interconnect 60b and the conductive layer 40. As shown in FIG. 4, the dielectric region 75b covers an outer surface 42 of the conductive layer 40, both inside the opening 30 and along the rear surface 22 of the semiconductor element 20. The dielectric region 75b can electrically insulate the conductive interconnect 60b from the conductive layer 40.

The dielectric region 75b can be compliant, having a sufficiently low modulus of elasticity and sufficient thickness such that the product of the modulus and the thickness provide compliancy. Specifically, such a compliant dielectric region 75b can allow the conductive interconnect 60b and the conductive contact 65b attached thereto to flex or move somewhat relative to the semiconductor element 20 when an external load is applied to the conductive contact. In that way, the bond between the conductive contacts 65b of the microelectronic unit 10b and terminals of a circuit panel (not shown) can better withstand thermal strain due to mismatch of the coefficient of thermal expansion ("CTE") between the microelectronic unit and the circuit panel.

As shown in FIG. 4, the dielectric region 75b can fill the remainder of the opening 30 that is not occupied by the conductive interconnect 60b or the conductive layer 40, such that an outer surface 76b extends above a plane defined by the rear surface 22 of the semiconductor element 20 and above a plane defined by the outer surface 42 of the portion of the conductive layer that extends along the rear surface of the semiconductor element. In particular embodiments, the outer surface 76b of the dielectric region 75b can be located at or below the plane defined by the rear surface 22 or at or below the plane defined by the outer surface 42 of the portion of the conductive layer 40 that extends along the rear surface.

The first aperture 71 is provided in the dielectric region 75b. The first aperture 71 has a frusto-conical shape and extends through the dielectric region 75b from an inward-facing surface 67b of the conductive contact 65b to the inward-facing surface 51 of the conductive pad 50. In particular embodiments, the first aperture can have other shapes, including for example, a cylindrical shape or a combination of a cylindrical and a frusto-conical shape at different distances from the rear surface. In the embodiment shown, a contour of the first aperture 71 (i.e., the shape of the outer surface of the first aperture 71) does not conform to a contour of the opening 30 or a contour of the conductive layer 40.

The conductive interconnect 60b can be formed either solid or hollow depending upon the process conditions. Under appropriate process conditions, a conductive interconnect that includes an internal space can be produced, and that internal space can then be filled with a dielectric material or a second conductive material, whereby the dielectric layer or the second conductive material overlies the conductive interconnect within the first aperture.

The conductive contact 65b can be aligned with the opening 30 and can be disposed wholly or partly within an area of the semiconductor element 20 defined by the opening. A plane defined by a top surface 68 of the conductive contact 65b is substantially parallel to the plane defined by the rear surface 22 of the semiconductor element 20. As shown, the conductive contact 65b has the shape of a conductive bond pad, e.g., a thin flat member. In other embodiments, the conductive contact can be any other type of conductive contact, including for example, a conductive post.

FIG. 5 is a sectional view illustrating a via structure in accordance with another embodiment having a plurality of holes extending from the same opening. As illustrated in FIG. 5, a microelectronic unit 110 includes a semiconductor element 120 having an opening 130 extending from a rear surface 122 partially through the semiconductor element 120 towards a front surface 121 remote from the rear surface. A conductive layer 140 extends conformally along the rear surface 122 and into the opening 130, the conductive layer conformally coating inner surfaces 131 of the opening and extending to lower ends 141 located adjacent a lower surface 132 of the opening.

The semiconductor element 120 also has a plurality of holes 180 extending from respective conductive pads 150 exposed at the front surface 121 and partially overlying the opening 130. The holes 180 meet the opening 130 at a location between the front surface 121 and the rear surface 122.

Each conductive pad 150 is electrically connected to a respective conductive contact 165 exposed at the rear surface 122 for electrical connection with an external device, the electrical connection being through a respective conductive interconnect 160 and a respective conductive via 190. Each conductive interconnect 160 extends between a respective conductive via 190 and a respective conductive contact 165 within the opening 130 and conforms to a contour of the inner surfaces 131 thereof.

Each conductive via 190 extends from a respective conductive pad 150 to a respective conductive interconnect 160 within a respective hole 180 and conforms to a contour of an inner surface 181 thereof. As shown in FIG. 5, each conductive via 190 extends from an inwardly-facing surface 151 of a respective conductive pad 150. In a particular embodiment, each conductive via 190 can extend through a respective conductive pad 150 and can contact the conductive pad 150 at least at an outwardly-facing surface 152 thereof. Each conductive via 190 can fill all of the volume within a respective hole 180 inside of a conformal dielectric layer 187 that electrically insulates the semiconductor element 120 from the conductive via, such that each conductive via can be conformal to a contour of the inner surface 181 of the respective hole.

A dielectric layer 170 conformally overlies the conductive layer 140 inside of the opening 130 and along the rear surface 122. The dielectric layer 170 electrically insulates the conductive interconnects 160 from the conductive layer 140. The dielectric layer 170 also extends along and is conformal to the lower surface 132 of the opening 130, although another dielectric layer 179 may be disposed between the dielectric layer 170 and the lower surface. The dielectric layers 170 and 179 can electrically insulate the conductive interconnects 160 from the silicon material of the lower surface 132 that is not coated by the conductive layer 140.

A dielectric layer 124 (e.g., a "passivation layer") extends along the front surface 121 and electrically insulates the conductive pads 150 from the semiconductor element 120. A dielectric region 175 occupies the volume between inner surfaces 161 of the conductive interconnects 160 and inward-facing surfaces 167 of the conductive contacts 165, such that an outer surface 176 of the dielectric region extends above but is parallel to a plane defined by the rear surface 122 of the semiconductor element 120.

Similar to the microelectronic unit 10 described with reference to FIG. 1, the conductive layer 140 can coat most of the rear surface 122 of the semiconductor element 120. The conductive layer 140 can serve to electrically shield the conductive interconnects 160 and the respective conductive vias 190 attached thereto that can carry input and/or output signals, such that the microelectronic unit 110 can experience less signal noise.

Figure 6:
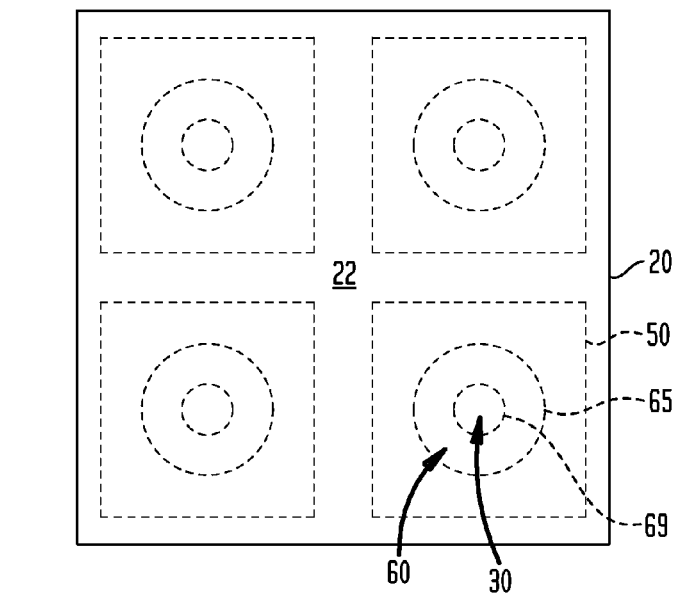
FIG. 6 is a corresponding top-down plan view illustrating a via structure in accordance with the embodiment of the invention depicted in FIG. 1.

FIG. 6 illustrates a microelectronic unit 10c that can be one potential top-down plan view of the microelectronic unit 10 shown in FIG. 1. As shown in FIG. 6, the microelectronic element 10c includes four openings 30 extending through a single semiconductor element 20, each opening having a substantially round top-view shape. Each opening 30 includes a conductive interconnect 60 extending therethrough from a round-shaped conductive contact 65 exposed at the rear surface 22 of the semiconductor element 20 to a bottom surface 69 of the conductive interconnect attached to a corresponding square-shaped conductive pad 50. Although four openings 30 are shown in the microelectronic unit 10c, the microelectronic units described herein can have any number of openings extending through a single semiconductor element.

Figure 7A:
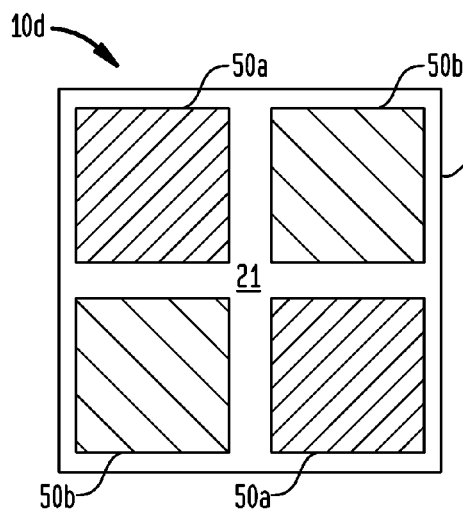
FIG. 7A is a corresponding bottom-up plan view illustrating the function of a via structure in accordance with the embodiment of the invention depicted in FIG. 6.

FIG. 7A illustrates a microelectronic unit 10d that can be one potential functional view of the front surface 21 of the semiconductor element 20 of the microelectronic unit 10c shown in FIG. 6. As shown in FIG. 7A, the microelectronic element 10d includes four square-shaped conductive pads 50a and 50b, each conductive pad at least partially overlying a corresponding opening in a single microelectronic element 20, for example, such as the arrangement of openings shown in FIG. 6.

In the microelectronic element 10d, each conductive pads 50a is electrically connected to a respective conductive interconnect that can carry input and/or output signals, such as the conductive interconnect 60 shown in FIG. 1. Each conductive pad 50b is electrically connected to a conductive layer that may be a continuous layer attached to a reference ground, or the conductive layer may be split with some or all of the areas thereof attached to ground or power, such as the conductive layer 40 shown in FIG. 1. In a particular embodiment, the conductive pads 50a can carry input and/or output signals, while the conductive pads 50b can be electrically connected to a reference ground. In one embodiment, the conductive pads 50b can be attached to a respective conductive interconnect in addition to a conductive layer, wherein both the conductive interconnect and the conductive layer can be electrically connected, for example, to a reference ground.

Figure 7B:
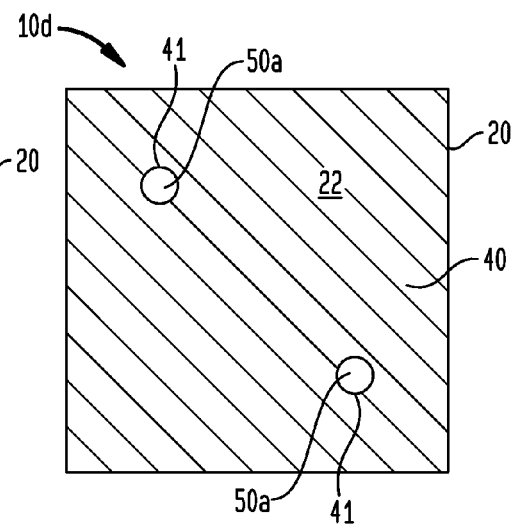
FIG. 7B is a corresponding top-down plan view illustrating the function of a via structure in accordance with the embodiment of the invention depicted in FIG. 7A.

FIG. 7B illustrates a microelectronic unit 10d that can be one potential functional view of the rear surface 22 of the semiconductor element 20 of the microelectronic unit 10c shown in FIG. 6. As shown in FIG. 7B, the microelectronic element 10d includes a conductive layer 40 that coats most of the rear surface 22. The conductive layer 40 can be electrically connected with the conductive pads 50b at the front surface 21 (shown in FIG. 7A). In a particular embodiment, the conductive layer 40 can be directly connected with the conductive pads (e.g., as shown in FIGS. 8-11).

As shown in FIG. 7B, the conductive layer 40 functionally extends across the entire rear surface 22 and the inner surfaces of the openings, except at the portions of the conductive pads 50a that are exposed at the lower ends 41 of the conductive layer.

FIG. 8 is a sectional view illustrating a variation of the via structure of FIG. 3 having an alternate conductive interconnect configuration that is suitable for connection to a reference ground. Such a via structure as shown in FIG. 8 can be used, for example, to electrically connect a conductive pad such as the conductive pad 50b shown in FIG. 7A to a conductive layer such as the conductive layer 40 shown in FIG. 7B, wherein both the conductive pad and the conductive layer are electrically connected to a reference ground.

The microelectronic unit 210 is similar to the microelectronic unit 10a described above, but rather than having a conductive interconnect that is electrically isolated from a conductive layer by one or more dielectric layers, the microelectronic unit 210 has a conductive interconnect 260 that is electrically connected to a conductive layer 240.

Lower ends 241 of the conductive layer 240 are connected to the conductive interconnect 260 adjacent the bottom surface 269 thereof. A dielectric layer 270 that extends conformally along the conductive layer 240 terminates adjacent the lower ends 241 thereof, such that when the conductive interconnect 260 is plated onto the dielectric layer, the conductive interconnect is formed with a connection to the lower ends of the conductive layer.

The conductive interconnect 260 is electrically connected with a conductive pad 250 exposed at the front surface 221 of the semiconductor element 220. An outwardly-facing surface 265 of the conductive interconnect 260 is exposed at the outer surface 272 of the dielectric layer 270 for interconnection to an external element. In a particular embodiment, a reference ground can be connected to the conductive pad 250 or the outwardly-facing surface 265, and the reference ground will also be electrically connected to the conductive layer 240 through the conductive interconnect 260.

The structure shown in FIG. 8 can be fabricated simultaneously with the fabrication of other structures having dual insulated conductors (such as shown for example in FIG. 1, 3, or 4) using a variation of the fabrication process described above with reference to FIGS. 2A-2H. In this case, after reaching the stage shown in FIG. 2D, the passivation layer 24 can be removed where exposed within the opening 30. Then, processing could continue as shown and described above with respect to FIGS. 2E-2H. However, in this case, because the passivation layer 24 has been removed, the conductive layer 40 directly contacts the surface 51 of the conductive pad 50.

When simultaneously fabricating dual conductor structures (e.g., as shown for example in FIG. 1, 3 or 4 or elsewhere herein) together with the reference conductor structure (e.g., that of FIG. 8), a resist layer can be deposited and patterned to cover portions of the rear surface 22 and some but not all of the openings 30 therein. The passivation layer 24 can be removed from only the openings where the reference conductor structure such as shown in FIG. 8 is to be formed. After removing the passivation layer 24 from particular openings, the resist layer can then be removed. When the metal layer 240 (e.g., that of FIG. 8) is formed, it will then be a continuous layer which contacts the conductive pad 250 and the interior surface of the semiconductor element within the opening 230. At the same time, the metal layer 40 in other structures such as that shown in FIG. 1, that is formed simultaneously with the metal layer 240 will be insulated from the respective conductive pad 50.

FIG. 9 is a sectional view illustrating a variation of the via structure of FIG. 4 having an alternate conductive interconnect configuration that is suitable for connection to a reference ground. The electrical structure of the microelectronic unit 210a (i.e., providing a conductive interconnect that is electrically connected to a conductive layer) is similar to the electrical structure of the microelectronic unit 210 shown in FIG. 8.

The microelectronic unit 210a is similar to the microelectronic unit 10b described above, but rather than having a conductive interconnect that is electrically isolated from a conductive layer by one or more dielectric layers, the microelectronic unit 210a has a conductive interconnect 260a that is electrically connected to a conductive layer 240.

Lower ends 241 of the conductive layer 240 are connected to the conductive interconnect 260a adjacent the bottom surface 269a thereof. A dielectric region 275 that extends between the conductive interconnect 260a and the conductive layer 240 terminates adjacent the lower ends 241 thereof, such that when the conductive interconnect 260a is plated into an aperture 271 located within the dielectric layer, the conductive interconnect is formed with a connection to the lower ends of the conductive layer.

As described above with reference to FIG. 8, the conductive interconnect 260a is electrically connected with a conductive pad 250 exposed at the front surface 221 of the semiconductor element 220. A conductive contact 265a attached to the conductive interconnect 260a is exposed at the outer surface 276 of the dielectric region 275 for interconnection to an external element. In a particular embodiment, a reference ground can be connected to the conductive pad 250 or the conductive contact 265a, and the reference ground will also be electrically connected to the conductive layer 240 through the conductive interconnect 260a.

FIG. 10 is a sectional view illustrating a variation of the via structure of FIG. 9 that is suitable for connection to a reference ground. The microelectronic unit 210b is similar to the microelectronic unit 210a described above. In microelectronic unit 210b, the conductive contact 265b can be electrically connected to the conductive pad 250 through the conductive layer 240b that contacts the surface of the semiconductor element within openings 230. The conductive contact 265b is connected with the conductive layer 240b at lateral edges 266 of the conductive contact.

A dielectric region 275b may fill all of the volume within the opening 230 that is not occupied by the conductive layer 240. The conductive contact 265b is exposed at a surface, e.g., an outer surface 276b of the dielectric region 275b for interconnection with an external device. In a particular embodiment, a conductive pad 250 or the conductive contact 265b can be connected to a source of power, ground or other reference potential, and the reference potential will also be electrically connected to the conductive layer 240 that extends therebetween and along the rear surface 222 of the semiconductor element 220.

FIG. 11 is a sectional view illustrating a variation of the via structure of FIG. 10 having a solid conductive region that is suitable for connection to a reference ground. The microelectronic unit 210c is similar to the microelectronic unit 210b described above, but rather than having a conductive layer that is electrically connected to a conductive pad and a conductive contact with a dielectric region filling the volume therebetween, the microelectronic unit 210b includes a solid conductive region 240c that fills all of the volume within an opening 230 extending through a thickness of a semiconductor element 220.

The microelectronic unit 210c does not have a separate conductive contact that is connected with a conductive pad through a conductive layer. Instead, the solid conductive region 240c extends along a rear surface 222 of the semiconductor element 220 and extends through the opening 230, contacting the conductive pad 250 at an inwardly-facing surface 251 thereof. The conductive region 240c has an outwardly-facing surface 265c thereof that is exposed at the rear surface 222 for electrical interconnection with an external device.

In a particular embodiment, a reference ground can be connected to the conductive pad 250 or the outwardly-facing surface 265c, and the reference ground will also be electrically connected to the conductive region 240 that extends therebetween and along the rear surface 222.

Figure 12:
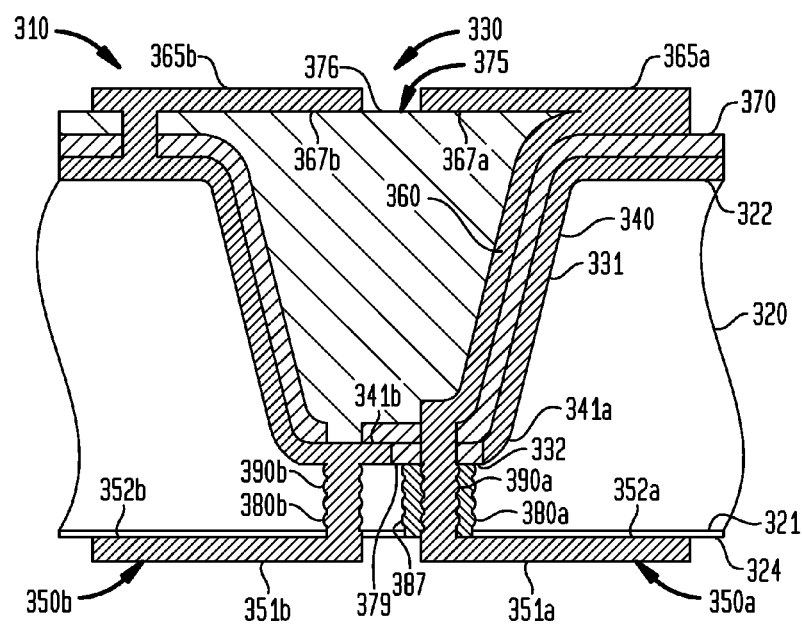
FIG. 12 is a sectional view illustrating a via structure in accordance with another embodiment.

FIG. 12 is a sectional view illustrating a via structure in accordance with another embodiment having a plurality of holes 380a, 380b which extend from the same opening 300 in the semiconductor element. In this case, a signal connection and a reference conductor connection (e.g., a connection for carrying a signal and a connection to a source of ground or power) can extend through separate holes 380a, 380b and also through the same opening 330. These connections can be electrically insulated from one another.

As illustrated in FIG. 12, a microelectronic unit 310 includes a semiconductor element 320 having an opening 330 extending from a rear surface 322 partially through the semiconductor element 320 towards a front surface 321 remote from the rear surface. A conductive layer 340 extends conformally along the rear surface 322 and into the opening 330, the conductive layer conformally coating inner surfaces 331 and a portion of a lower surface 332 of the opening and extending to lower ends 341a located adjacent the lower surface of the opening and 341b located at the lower surface of the opening.

The semiconductor element 320 also has a plurality of holes 380a and 380b extending from respective conductive pads 350a and 350b exposed at the front surface 321 and partially overlying the opening 330. Each of the holes 380a and 380b meets the opening 330 at a location between the front surface 321 and the rear surface 322. As shown in FIG. 12, the holes can be separated from each other by semiconductor material within the semiconductor element. In a variation thereof, the holes can be separated from each other by dielectric material (not shown) between them or by a combination of the semiconductor material and dielectric material. Vias 390a and 390b extend within respective holes 380a, 380b. The vias can conform to the contours of the interior surfaces of the holes.

As shown in FIG. 12, each conductive via 390a and 390b extends from an inwardly-facing surface 351a and 351b of a respective conductive pad 350a and 350b. In a particular embodiment, each conductive via 390a and 390b can extend through a respective conductive pad 350a and 350b and can contact the conductive pad at least at a respective outwardly-facing surface 352a and 352b thereof.

The conductive via 390a can fill all of the volume within the hole 380a inside of a conformal dielectric layer 387 that electrically insulates the semiconductor element 320 from the conductive via, such that the conductive via can be conformal to a contour of the inner surface of the hole. The conductive via 390b can fill all of the volume within a respective hole 380b, such that the conductive via can be conformal to a contour of the inner surface of the hole. In the case of via 390b, there need not be a dielectric layer insulating it from an interior surface of the hole 380b.

Each conductive pad 350a and 350b is electrically connected to a respective conductive contact 365a and 365b exposed at the rear surface 322 for electrical connection with an external device. The electrical connection between the conductive pad 350a and the conductive contact 365a is through a conductive interconnect 360 and a conductive via 390a. The electrical connection between the conductive pad 350b and the conductive contact 365b is through conductive layer 340 and conductive via 390b. The conductive interconnect 360 can extend within the opening 330 between the conductive via 390a and the conductive contact 365a and can conform to a contour of an inner surface 331 of the opening.

A dielectric layer 370 can conform to a contour of a surface of the conductive layer 340 inside the opening 330 and along the rear surface 322. The dielectric layer 370 can electrically insulate the conductive interconnect 360 from the conductive layer 340. The dielectric layer 370 can also extend along and conform to a contour of the lower surface 332 of the opening 330, although another dielectric layer 379 may be disposed between the dielectric layer 370 and the lower surface. The dielectric layers 370 and 379 can electrically insulate the conductive interconnect 360 from the silicon material of the lower surface 332 that is not coated by the conductive layer 340.

A dielectric layer 324 (e.g., a "passivation layer") can extend along the front surface 321 and electrically insulates the conductive pads 350a and 350b from the semiconductor element 320, although the conductive pad 350b can be electrically connected with the semiconductor element through the conductive layer 340. A dielectric region 375 occupies the volume between an inner surface 361 of the conductive interconnect 360, the exposed outer surface 372 of the dielectric layer 370, and inward-facing surfaces 367a and 367b of the conductive contacts 365a and 365b, such that an outer surface 376 of the dielectric region extends above but is parallel to a plane defined by the rear surface 322 of the semiconductor element 320.

Similar to the microelectronic unit 10 described with reference to FIG. 1, the conductive layer 340 can coat most of the rear surface 322 of the semiconductor element 320. The conductive layer 340 can serve as a reference conductor of a transmission line which is adapted to carry a signal through the semiconductor element by way of the via 390a and conductive interconnect 360. In this way, a desired impedance can be achieved for such transmission line. The conductive layer 340 may electrically shield the conductive interconnect 360 and the respective conductive via 390a attached thereto in the transmission of a signal.

Similar to the microelectronic units described with reference to FIGS. 8-11, in a particular embodiment, a reference ground or power input/output can be connected to the conductive pad 350*b* or the conductive contact 365*b*, and the reference ground or power input/output will also be electrically connected to the conductive layer 340 that extends therebetween.

The methods disclosed herein for forming via structures in semiconductor elements can be applied to a microelectronic substrate, such as a single semiconductor chip, or can be applied simultaneously to a plurality of individual semiconductor chips which can be held at defined spacings in a fixture or on a carrier for simultaneous processing. Alternatively, the methods disclosed herein can be applied to a microelectronic substrate or element including a plurality of semiconductor chips which are attached together in form of a wafer or portion of a wafer to perform processing as described above simultaneously with respect to a plurality of semiconductor chips on a wafer-level, panel-level or strip-level scale.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory.

Figure 13:
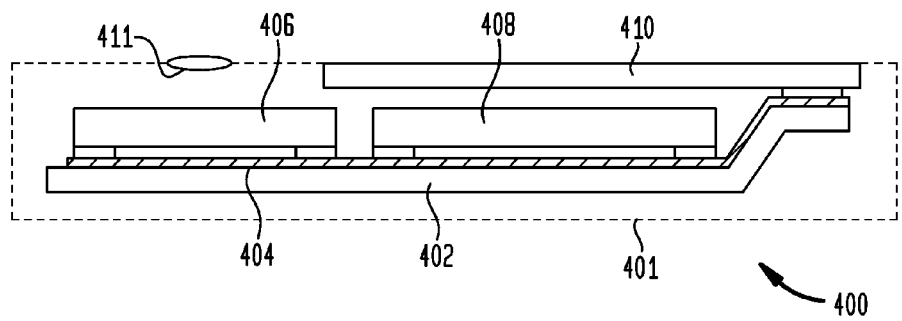
FIG. 13 is a schematic depiction of a system according to one embodiment of the invention.

The structures discussed above can be utilized in construction of diverse electronic systems. For example, a system 400 in accordance with a further embodiment of the invention includes a structure 406 as described above in conjunction with other electronic components 408 and 410. In the example depicted, component 408 is a semiconductor chip whereas component 410 is a display screen, but any other components can be used. Of course, although only two additional components are depicted in FIG. 13 for clarity of illustration, the system may include any number of such components. The structure 406 as described above may be, for example, a microelectronic unit as discussed above in connection with FIG. 1, or a structure incorporating plural microelectronic units. In a further variant, both may be provided, and any number of such structures may be used.

Structure 406 and components 408 and 410 are mounted in a common housing 401, schematically depicted in broken lines, and are electrically interconnected with one another as necessary to form the desired circuit. In the exemplary system shown, the system includes a circuit panel 402 such as a flexible printed circuit board, and the circuit panel includes numerous conductors 404, of which only one is depicted in FIG. 13, interconnecting the components with one another. However, this is merely exemplary; any suitable structure for making electrical connections can be used.

The housing 401 is depicted as a portable housing of the type usable, for example, in a cellular telephone or personal digital assistant, and screen 410 is exposed at the surface of the housing. Where structure 406 includes a light-sensitive element such as an imaging chip, a lens 411 or other optical device also may be provided for routing light to the structure. Again, the simplified system shown in FIG. 13 is merely exemplary; other systems, including systems commonly regarded as fixed structures, such as desktop computers, routers and the like can be made using the structures discussed above.

The vias and via conductors disclosed herein can be formed by processes such as those disclosed in greater detail in the co-pending, commonly assigned U.S. patent application Ser. Nos. 12/842,717, 12/842,651, 12/842,612, 12/842,669, 12/842,692, and 12/842,587, filed on Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic unit, comprising:
a semiconductor element consisting essentially of semiconductor material and having a front surface, a rear surface, a plurality of active semiconductor devices adjacent the front surface, a plurality of conductive pads exposed at the front surface, and an opening extending through the semiconductor element, wherein at least one of the conductive pads at least partially overlies the opening and is electrically connected with at least one of the active semiconductor devices;
a first conductive element exposed at the rear surface for connection with an external component, the first conductive element extending through the opening and electrically connected with the at least one conductive pad; and
a second conductive element extending through the opening and insulated from the first conductive element,
wherein the at least one conductive pad overlies a peripheral edge of the second conductive element, and
wherein the second conductive element directly contacts an interior surface of the semiconductor material within the opening.

2. The microelectronic unit as claimed in claim 1, wherein the second conductive element is connectable to a reference potential.

3. The microelectronic unit as claimed in claim 2, wherein the first and second conductive elements are arranged to permit a desired impedance to be achieved for carrying a signal by the first conductive element.

4. The microelectronic unit as claimed in claim 2, wherein the first and second conductive elements are arranged to improve electrical parasitics such as reducing cross-talk or improving signal to noise ratio.

5. The microelectronic unit as claimed in claim 1, wherein the opening extends completely through a thickness of the semiconductor element.

6. The microelectronic unit as claimed in claim 1, wherein the first and second conductive elements are arranged to permit a desired impedance to be achieved for a signal carried by the first conductive element.

7. The microelectronic unit as claimed in claim 1, wherein the at least one conductive pad has an inwardly-facing surface remote from the exposed surface of the conductive pad, and the edge of the second conductive element is disposed below a height defined by the inwardly-facing surface of the conductive pad.

8. The microelectronic unit as claimed in claim 1, wherein the second conductive element extends along an interior surface of the opening and the first conductive element is separated from the second conductive element by a thickness of a dielectric layer therebetween.

9. The microelectronic unit as claimed in claim 8, wherein the dielectric layer includes an aperture exposing the at least one conductive pad, the aperture having a contour that at least does not fully conform to a contour of the interior surface of the opening, and the first conductive element is disposed in the aperture.

10. The microelectronic unit as claimed in claim 1, wherein the second conductive element is deposited directly onto the interior surface of the semiconductor material within the opening.

11. The microelectronic unit as claimed in claim 1, wherein the second conductive element is deposited by at least one of plating, physical and/or chemical vapor deposition, physical and/or chemical plasma deposition, a Bosch process, and atomic layer deposition.

12. The microelectronic unit as claimed in claim 1, wherein the second conductive element at least substantially surrounds the first conductive element.

13. The microelectronic unit as claimed in claim 1, wherein the second conductive element conforms to a contour of an interior surface of the opening.

14. The microelectronic unit as claimed in claim 13, wherein a dielectric layer between the first and second conductive elements has a surface which conforms to a contour of a surface of the interior surface of the opening, and the first conductive element is formed on the surface of the dielectric layer, such that the first conductive element conforms to a contour of the interior surface of the opening.

15. The microelectronic unit as claimed in claim 1, wherein the second conductive element is separated from the at least one conductive pad by at least one dielectric layer disposed therebetween.

16. The microelectronic unit as claimed in claim 1, wherein the first conductive element includes a contact portion exposed at the rear surface and configured for electrical interconnection with the external component, the contact portion at least partially overlying the at least one conductive pad to which it is electrically connected.

17. The microelectronic unit as claimed in claim 16, wherein the contact portion fully overlies the at least one conductive pad to which it is electrically connected.

18. The microelectronic unit as claimed in claim 16, wherein the first conductive element fills a volume between surfaces of a dielectric layer within the opening.

19. The microelectronic unit as claimed in claim 1, wherein the conductive pads and the first and second conductive elements are adapted for electrical interconnection with a component external to the microelectronic unit.

20. The microelectronic unit as claimed in claim 1, wherein the second conductive element includes a plurality of metal layers of differing composition.

21. The microelectronic unit as claimed in claim 1, wherein the opening in the semiconductor element includes a first opening extending from the rear surface towards the front surface and includes a hole extending from the first opening to the at least one conductive pad, wherein the first opening and the hole meet at a combined aperture having a first width, and the hole has a second width smaller than the first width where the hole meets the at least one conductive pad.

22. The microelectronic unit as claimed in claim 21, wherein the first opening has a first width in a lateral direction along the rear surface, the hole has a second width in the lateral direction where the hole meets the first opening, and the hole has a third width in the lateral direction adjacent the conductive pad, the first width being greater than the second width, and the second width being greater than the third width.

23. The microelectronic unit as claimed in claim 1 further comprising a third conductive element extending through a second opening and electrically connected to a second conductive pad, the third conductive element being connectable to a reference potential.

24. The microelectronic unit as claimed in claim 1, wherein the opening in the semiconductor element is at least partly aligned with at least two of the plurality of conductive pads and the second conductive element extends along an interior surface of the opening adjacent to the at least two conductive pads.

25. The microelectronic unit as claimed in claim 24, comprising a plurality of the first conductive elements, each electrically connected to a respective one of the at least two conductive pads and exposed at the rear surface.

26. The microelectronic unit as claimed in claim 24, wherein the second conductive element is connectable to a reference potential.

27. The microelectronic unit as claimed in claim 26, wherein the second conductive element and the plurality of the first conductive elements are arranged to permit a desired impedance to be achieved for carrying signals by the first conductive elements.

28. A component, comprising:
a passive element consisting essentially of a semiconductor material and having a front surface, a rear surface, a plurality of conductive pads exposed at the front surface, and an opening extending through the passive element, wherein at least one of the conductive pads at least partially overlies the opening;
a first conductive element exposed at the rear surface for connection with an external component, the first conductive element extending through the opening and electrically connected with the at least one conductive pad; and
a second conductive element extending through the opening and insulated from the first conductive element, the second conductive element directly contacting an interior surface of the semiconductor material within the opening,
wherein the at least one conductive pad overlies a peripheral edge of the second conductive element.

29. The component as claimed in claim 28, wherein the second conductive element is connectable to a reference potential.

30. The component as claimed in claim 28, wherein the passive element has a plurality of passive circuit elements thereon.

31. The component as claimed in claim 28, wherein the passive element consists essentially of glass.

32. The component as claimed in claim 28, wherein the passive element consists essentially of silicon.

33. The component as claimed in claim 28, wherein the conductive pads and the first and second conductive elements are adapted for electrical interconnection with a device external to the component.

34. A microelectronic unit, comprising:
a semiconductor element consisting essentially of semiconductor material and having a front surface, a rear surface, a plurality of active semiconductor devices adjacent the front surface, a plurality of conductive pads exposed at the front surface, and an opening extending through the semiconductor element, wherein at least one of the conductive pads at least partially overlies the opening and is electrically connected with at least one of the active semiconductor devices;

a first conductive element exposed at the rear surface for connection with an external component, the first conductive element extending through the opening and electrically connected with the at least one conductive pad; and a second conductive element extending through the opening and insulated from the first conductive element, wherein the at least one conductive pad overlies a peripheral edge of the second conductive element, the peripheral edge of the second conductive element defining an opening through which the first conductive element extends, such that the peripheral edge of the second conductive element extends around the first conductive element, and wherein the second conductive element directly contacts an interior surface of the semiconductor material within the opening.

35. A system comprising a structure according to any one of claim 1, 28, or 34 and one or more other electronic components electrically connected with the structure.

36. A system as claimed in claim 35, further comprising a housing, said structure and said other electronic components being mounted to said housing.

* * * * *